(12) United States Patent
Kim et al.

(10) Patent No.: US 12,171,111 B2
(45) Date of Patent: Dec. 17, 2024

(54) DISPLAY PANEL AND ELECTROLUMINESCENT DISPLAY DEVICE INCLUDING THE SAME

(71) Applicant: LG DISPLAY CO., LTD., Seoul (KR)

(72) Inventors: Taesuk Kim, Paju-si (KR); Youngmu Oh, Paju-si (KR); Seonghyun Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 495 days.

(21) Appl. No.: 17/538,152

(22) Filed: Nov. 30, 2021

(65) Prior Publication Data

US 2022/0199938 A1    Jun. 23, 2022

(30) Foreign Application Priority Data

Dec. 21, 2020    (KR) .......................... 10-2020-0179468

(51) Int. Cl.
*H10K 50/824*    (2023.01)
*H10K 59/122*    (2023.01)
(Continued)

(52) U.S. Cl.
CPC ......... *H10K 50/824* (2023.02); *H10K 59/122* (2023.02); *H10K 59/124* (2023.02); *H10K 59/131* (2023.02)

(58) Field of Classification Search
CPC ......... H10K 59/80522; H10K 59/8051; H10K 59/1213; H10K 50/824; H10K 59/122;
(Continued)

(56) References Cited

U.S. PATENT DOCUMENTS

2017/0069871 A1    3/2017  Yim et al.
2018/0120620 A1*   5/2018  Shim .................... H10K 59/122
(Continued)

FOREIGN PATENT DOCUMENTS

KR    10-2017-0029037 A    3/2017
KR    10-2018-0078830 A    7/2018
KR    10-2020-0031432 A    3/2020

OTHER PUBLICATIONS

Korean Office Action dated Mar. 7, 2024 issued in Patent Application No. 10-2020-0179468 (8 pages).

*Primary Examiner* — Julia Slutsker
(74) *Attorney, Agent, or Firm* — POLSINELLI PC

(57) ABSTRACT

A display panel includes a first insulation film including a first hole exposing a portion of an upper surface of an auxiliary electrode, a second insulation film including a second hole overlapping the first hole of the first insulation film, an electrode pattern disposed on a portion of an upper surface of the first insulation film and overlapping the second hole of the second insulation film, a first electrode of a light emitting device disposed on the second insulation film, a bank overlapping a portion of an upper surface of the first electrode and disposed on the second insulation film, a light emitting layer of the light emitting layer disposed on the portion of the upper surface of the auxiliary electrode, and a second electrode of the light emitting device, contacting the portion of the upper surface of the auxiliary electrode overlapping the first hole of the first insulation film, thereby allowing the cathode electrode and the auxiliary electrode to be electrically connected with each other.

17 Claims, 13 Drawing Sheets

(51) Int. Cl.
*H10K 59/124* (2023.01)
*H10K 59/131* (2023.01)

(58) Field of Classification Search
CPC ... H10K 59/124; H10K 59/131; H01L 27/124
See application file for complete search history.

(56) References Cited

U.S. PATENT DOCUMENTS

2019/0206973 A1* 7/2019 Kim ................. H10K 71/00
2019/0207168 A1* 7/2019 Lee ................. H10K 59/122

* cited by examiner

DISPLAY PANEL AND ELECTROLUMINESCENT DISPLAY DEVICE INCLUDING THE SAME

CROSS-REFERENCE TO RELATED APPLICATION

This application claims priority from Korean Patent Application No. 10-2020-0179468, filed on Dec. 21, 2020, which is hereby incorporated by reference in its entirety for all purposes as if fully set forth herein.

BACKGROUND

Field of the Disclosure

The present disclosure relates to a display panel and an electroluminescent display device including the same.

Description of the Background

In general, electronic devices, such as monitors, TVs, laptops, and digital cameras, include a display device for implementing images. For example, display devices may include liquid crystal display devices and electroluminescent display devices.

Large-scale electroluminescent display devices have difficulty in maintaining uniform luminance and may suffer from differences in luminance between the edge area and the central area. When a current flows from the cathode electrode of the light emitting device between the edge area and the central area, the current reaches far away from where it enters. In this case, a voltage drop may occur due to the resistance of the cathode electrode of the light emitting device, causing a difference in luminance between the edge area and the central area.

In other words, in large-scale electroluminescent display devices, the luminance uniformity may be drastically lowered due to differences in luminance between the edge area and the central area due to the resistance of the upper electrodes of the light emitting devices. Thus, a need exists for means to compensate for luminance differences.

SUMMARY

The present disclosure is to provide a display panel having a structure in which the cathode electrode of the light emitting device may be electrically connected with the auxiliary electrode without an inversely tapered barrier rib structure and an electroluminescent display device including the same.

The present disclosure is also to provide a display panel having a structure capable of preventing separation of a bank and an insulation film disposed in an area corresponding to an area in which an auxiliary electrode is disposed, and an electroluminescent display including the same.

The present disclosure is still to provide a display panel having a structure capable of preventing damage to an electrode pattern due to static electricity between an auxiliary electrode and an electrode pattern disposed between a bank and an insulation film and an electroluminescent display device including the same.

Further, the present disclosure is to provide a display panel having a structure in which an electrode pattern may be prevented from oxidation and denaturation and an electroluminescent display device including the same.

According to an aspect of the disclosure, there may be provided an electroluminescent display device comprises at least one auxiliary electrode disposed on a substrate, a first insulation film disposed on the auxiliary electrode and including a first hole exposing a portion of an upper surface of the auxiliary electrode, a second insulation film disposed on the first insulation film and including a second hole overlapping the first hole, an electrode pattern disposed on a portion of an upper surface of the first insulation film and overlapping the second hole of the second insulation film, a first electrode of a light emitting device disposed on the second insulation film, a bank overlapping a portion of an upper surface of the first electrode and disposed on the second insulation film, a light emitting layer of the light emitting device, disposed on the first electrode and the bank and disposed on the portion of the upper surface of the auxiliary electrode overlapping the first hole of the first insulation film, and a second electrode of the light emitting device, disposed on the light emitting layer and contacting the portion of the upper surface of the auxiliary electrode overlapping the first hole.

According to an aspect of the disclosure, there may be provided a display panel comprises at least one auxiliary electrode disposed on a substrate, a first insulation film disposed on the auxiliary electrode and including a first hole exposing a portion of an upper surface of the auxiliary electrode, a second insulation film disposed on the first insulation film and including a second hole overlapping the first hole and having a larger area than the first hole, an electrode pattern disposed on a portion of an upper surface of the first insulation film and overlapping the second hole of the second insulation film, a first electrode of a light emitting device disposed on the second insulation film, a bank overlapping a portion of an upper surface of the first electrode and disposed on the second insulation film, a light emitting layer of the light emitting device, disposed on the first electrode and the bank and disposed on the portion of the upper surface of the auxiliary electrode, and a second electrode of the light emitting device, disposed on the light emitting layer and contacting the portion of the upper surface of the auxiliary electrode overlapping the first hole.

According to aspects of the disclosure, there may be provided a display panel having a structure in which the cathode electrode of the light emitting device may be electrically connected with the auxiliary electrode without an inversely tapered barrier rib structure by including the first insulation film including the first hole overlapping the auxiliary electrode, the second insulation film including the second hole disposed on the first insulation film and having a larger area than the first hole, and the bank disposed on the second insulation film and overlapping a portion of the first hole, and an electroluminescent display device including the display panel.

According to aspects of the disclosure, there may be provided a display panel having a structure capable of preventing separation between the insulation film and the bank disposed in the area corresponding to the area where the auxiliary electrode is disposed by positioning the electrode pattern between the insulation film and the bank in the area corresponding to the area in which the auxiliary electrode is disposed, and an electroluminescent display device including the display panel.

According to aspects of the disclosure, there may be provided a display panel having a structure capable of preventing damage to the electrode pattern due to static electricity between the auxiliary electrode and the electrode pattern disposed between the bank and the insulation film as the auxiliary electrode and the electrode pattern do not overlap in the area where it overlaps the first hole of the first insulation film, and an electroluminescent display device including the display panel.

According to aspects of the disclosure, there may be provided a display panel having a structure in which the electrode pattern may be prevented from oxidation, denaturation, or other damage by covering the entire upper and side surfaces of the electrode pattern with the bank, and an electroluminescent display device including the display panel.

BRIEF DESCRIPTION OF THE DRAWINGS

The above and other features and advantages of the disclosure will be more clearly understood from the following detailed description, taken in conjunction with the accompanying drawings, in which.

DETAILED DESCRIPTION

Figure 1:
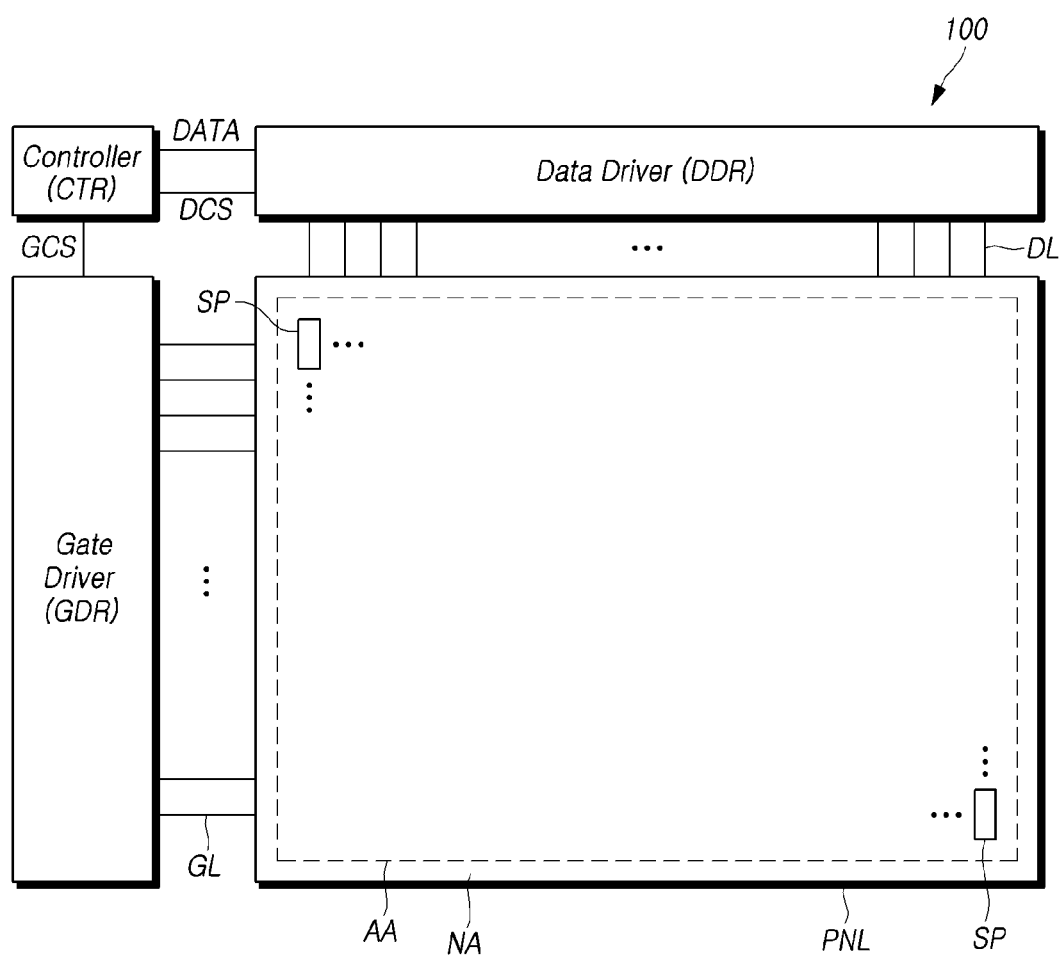
FIG. 1 is a view schematically illustrating a system configuration of an electroluminescent display device according to aspects of the disclosure.

In the following description of examples or aspects of the disclosure, reference will be made to the accompanying drawings in which it is shown by way of illustration specific examples or aspects that can be implemented, and in which the same reference numerals and signs can be used to designate the same or like components even when they are shown in different accompanying drawings from one another. Further, in the following description of examples or aspects of the disclosure, detailed descriptions of well-known functions and components incorporated herein will be omitted when it is determined that the description may make the subject matter in some aspects of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a view schematically illustrating a system configuration of an electroluminescent display device according to aspects of the disclosure.

According to aspects of the disclosure, electroluminescent displays may include, e.g., electroluminescent display devices 100, lighting devices, or light emitting devices. Hereinafter, for convenience of description, electroluminescent display devices 100 are primarily described. However, aspects of the disclosure may also be applied to other various electroluminescent displays, such as lighting devices or light emitting devices.

According to aspects of the disclosure, the electroluminescent display device 100 may include a display panel (PNL) for displaying images or outputting light and a driving circuit for driving the display panel (PNL).

According to aspects of the disclosure, the electroluminescent display device 100 may be a bottom emission-type electroluminescent display device, which emits light toward the substrate on which light emitting devices are disposed, but aspects of the disclosure are not limited thereto. In some cases, the electroluminescent display device 100 of the disclosure may be a top emission-type electroluminescent display device, which emits light away from the substrate on which light emitting devices are disposed, or a dual emission-type electroluminescent display device which emits light towards and away from the substrate.

The display panel PNL may have a plurality of data lines DL and a plurality of gate lines GL. The display panel PNL may have a plurality of subpixels SP, defined by a plurality of data lines DL and a plurality of gate lines GL, arranged in a matrix type.

In the display panel PNL, the plurality of data lines DL and the plurality of gate lines GL may be disposed to cross each other. For example, the plurality of gate lines GL may be arranged in rows or columns, and the plurality of data lines DL may be arranged in columns or rows. For ease of description, it is assumed below that the plurality of gate lines GL are arranged in rows, and the plurality of data lines DL are arranged in columns.

The display panel PNL may have other types of signal lines, as well as the plurality of data lines DL and the plurality of gate lines GL, depending on, e.g., the subpixel structure. The display panel PNL may further have a driving power line, a reference power line, or a common power line.

The type of the signal lines disposed on the panel PNL may be varied depending on, e.g., the subpixel structure. In this disclosure, the concept of signal line may encompass signal-applied electrodes.

The display panel PNL may include an active area A/A for displaying pictures or images and a non-active area N/A, in which no image is displayed, around the active area A/A. The non-active area N/A is also referred to as a bezel area.

The active area A/A includes a plurality of subpixels SP for displaying images.

The non-active area N/A has a pad area for electrical connection with a data driver DDR. The non-active area N/A may have a plurality of data link lines to connect the pad area with the plurality of data lines DL. The plurality of data link lines may be extensions of the plurality of data lines DL to the non-active area N/A or may be separate patterns electrically connected with the plurality of data lines DL.

The non-active area N/A may also include gate driving-related lines to transfer voltage (signals) necessary for gate driving to a gate driver GDR through pads electrically connected with the data driver DDR. For example, the gate driving-related lines may include clock lines for transferring clock signals, gate power lines for transferring gate voltages VGH and VGL, and gate driving control signal lines for transferring various control signals necessary to generate scan signals. The gate driving-related lines are disposed in the non-active area N/A, unlike the gate lines GL disposed in the active area A/A.

The driving circuit may include the data driver DDR for driving the plurality of display device, the gate driver GDR for driving the plurality of gate lines GL, and a controller CTR for controlling the data driver DDR and the gate driver GDR.

The data driver DDR may drive the plurality of data lines DL by outputting data voltage to the plurality of data lines DL.

The gate driver GDR may drive the plurality of gate lines GL by outputting scan signals to the plurality of gate lines GL.

The controller CTR may control the driving operation of the data driver Data driver DDR and gate driver GDR by supplying various control signals DCS and GCS necessary for the driving operation of the data driver DDR and gate driver GDR. Further, the controller CTR may supply image data DATA to the data driver DDR.

The controller (CTR) starts scanning according to the timing implemented in each frame. The controller CTR converts input image data input from the outside into image data DATA suited for the data signal format used in the data driver DDR, outputs the image data DATA, and controls data driving at an appropriate time for scanning.

To control the data driver DDR and gate driver GDR, the controller CTR receives timing signals, such as a vertical sync signal Vsync, horizontal sync signal Hsync, input data enable signal (Data Enable (DE)), or clock signal CLK form the outside (e.g., a host system) and may generate various control signals. The controller CTR outputs the generated control signals to the data driver DDR and the gate driver GDR.

As an example, to control the gate driver GDR, the controller CTR outputs various gate control signals GCS including a gate start pulse GSP, a gate shift clock GSC, and a gate output enable signal (Gate Output Enable, GOE).

To control the data driver DDR, the controller CTR outputs various data control signals DCS including, e.g., a source start pulse SSP, a source sampling clock SSC, and a source output enable signal (Source Output Enable, SOE).

The controller CTR may be a timing controller used in a typical display technology. Alternatively, the controller CTR may be a control device capable of further performing other control functions including the timing controller.

The controller CTR may be implemented as a separate component from the data driver DDR. Alternatively, the controller CTR may be integrated with the data driver DDR in an integrated circuit.

The data driver DDR receives the image data DATA from the controller CTR and supply data voltage to the plurality of data lines DL, thereby driving the plurality of data lines DL. Here, the data driver DDR is also referred to as a source driver.

The data driver DDR may exchange various signals with the controller CTR via various interfaces.

The gate driver GDR sequentially drives the plurality of gate lines GL by sequentially supplying scan signals to the plurality of gate lines GL. Here, the gate driver GDR is also referred to as a scan driver.

The gate driver GDR sequentially supplies scan signals of On voltage or Off voltage to the plurality of gate lines GL under the control of the controller CTR.

When a specific gate line is turned on by the gate driver GDR, the data driver DDR converts the image data DATA received from the controller CTR into an analog data voltage and supplies the analog data voltage to the plurality of data lines DL.

The data driver DDR may be positioned on one side (e.g., an upper or lower side) of the display panel PNL. However, aspects of the disclosure are not limited thereto. For example, data drivers DDR may be positioned on both the sides (e.g., both the upper and lower sides) of the display panel PNL depending on a driving scheme or a display panel design scheme.

The gate driver GDR may be positioned on one side (e.g., a left or right side) of the display panel PNL. However, aspects of the disclosure are not limited thereto. For example, gate drivers GDR may be positioned on both the sides (e.g., both the left and right sides) of the display panel PNL depending on a driving scheme or a display panel design scheme.

The data driver DDR may include one or more source driver integrated circuits (SDICs).

Each source driver integrated circuit (SDIC) may include a shift register, a latch circuit, a digital-to-analog converter (DAC), and an output buffer. In some cases, the data driver DDR may further include one or more analog-digital converters ADC.

Each source driver integrated circuit SDIC may be connected, in a tape automated bonding (TAB) type or chip-on-glass (COG) type, to the bonding pad of the display panel PNL. Alternatively, each source driver integrated circuit SDIC may be directly disposed on the display panel PNL. In some cases, each source driver integrated circuit (SDIC)

may be integrated and disposed on the display panel PNL. Each source driver integrated circuit (SDIC) may be implemented in a chip-on-film (COF) type. In this case, each source driver integrated circuit SDIC may be mounted on a circuit film. Each source driver integrated circuit SDIC mounted on the circuit film may be electrically connected to the data lines DL of the display panel PNL through the circuit film.

The gate driver GDR may include a plurality of gate driving circuits GDC. The plurality of gate driving circuits may respectively correspond to the plurality of gate lines GL.

Each gate driving circuit GDC may include, e.g., a shift register and a level shifter.

Each gate driving circuit GDC may be connected to a bonding pad of the display panel PNL in a TAB type or a COG type. Each gate driving circuit GDC may be implemented in a chip-on-film (COF) type. In this case, each gate driving circuit GDC may be mounted on a circuit film. Each gate driving circuit GDC mounted on the circuit film may be electrically connected to the gate lines GL of the display panel PNL through the circuit film. Each gate driving circuit GDC may be implemented in a gate-in-panel (GIP) type and be embedded in the display panel PNL. Accordingly, each gate driving circuit GDC may be directly formed on the display panel PNL.

Figure 2:
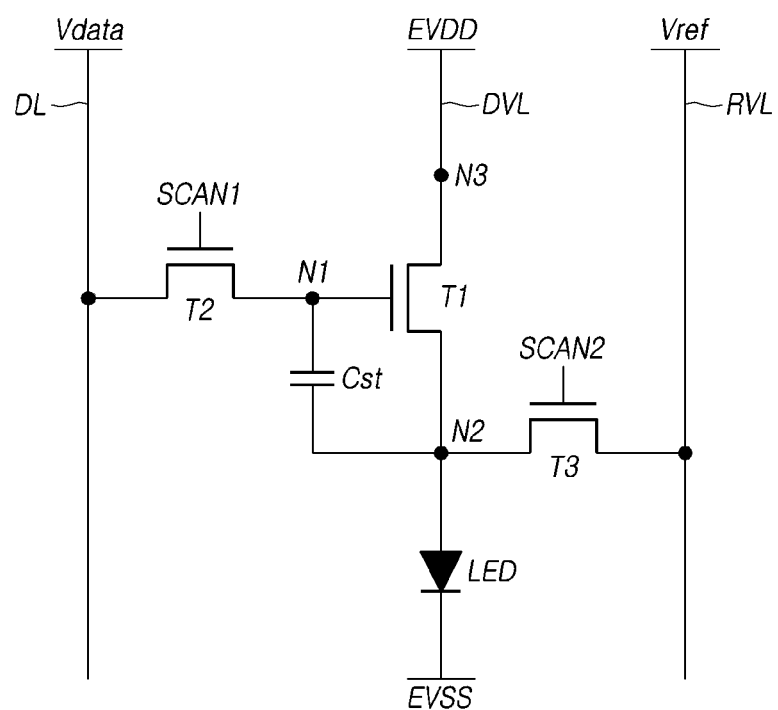
FIG. 2 is a view illustrating a structure of a subpixel in a display panel according to aspects of the disclosure.

FIG. 2 is a view illustrating a structure of a subpixel of a display panel according to aspects of the disclosure.

Referring to FIG. 2, each subpixel SP in the display panel PNL may further include a second transistor T2 to transfer data voltage Vdata to a first node N1, which corresponds to a gate node of the driving transistor T1, and a storage capacitor Cst to maintain the data voltage Vdata corresponding to an image signal voltage or a voltage corresponding to the data voltage Vdata for the time of one frame.

The light emitting device LED may include a first electrode (an anode electrode or cathode electrode), an organic layer including at least one light emitting layer, and a second electrode (a cathode electrode or anode electrode).

For example, a base voltage EVSS or a low power voltage may be applied to the second electrode of the light emitting device LED.

The driving transistor T1 drives the organic light emitting device LED by supplying a driving current to the light emitting device LED.

The driving transistor T1 includes the first node N1, second node N2, and third node N3.

The "node" in the first to third nodes N1, N2, and N3 may mean a point, electrode(s), or wiring(s) having the same electrical state.

Each of the first node N1, the second node N2, and the third node N3 may include one or more electrodes.

The first node N1 of the driving transistor T1 is a node corresponding to a gate node and may be electrically connected to a source node or a drain node of the second transistor T2.

The second node N2 of the driving transistor T1 may be electrically connected with the first electrode 301 of the light emitting device LED and may be a source node or a drain node.

The third node N3 of the driving transistor T1 is a node to which the driving voltage EVDD is applied and may be electrically connected to a driving voltage line DVL that supplies the driving voltage EVDD. The third node N3 of the driving transistor T1 may be a drain node or a source node.

The driving transistor T1 and the second transistor T2 may be implemented as an n-type or a p-type.

The second transistor T2 may be electrically connected between the data line DL and the first node N1 of the driving transistor T1 and may be controlled by receiving the scan signal SCAN through the gate line and the gate node.

The second transistor T2 may be turned on by the scan signal SCAN to transfer the data voltage Vdata supplied from the data line DL to the first node N1 of the driving transistor T1.

The storage capacitor Cst may be electrically connected between the first node N1 and second node N2 of the driving transistor T1.

The storage capacitor Cst is an external capacitor intentionally designed to be outside the driving transistor T1, but not a parasite capacitor (e.g., Cgs or Cgd) which is an internal capacitor present between the first node N1 and the second node N2 of the driving transistor T1.

The third transistor T3 may be electrically connected between the second node N2 of the driving transistor T1 and the reference voltage line RVL and receive a second scan signal SCAN2 through the gate node to be controlled for its on/off.

The drain node of the third transistor T3 may be electrically connected to the reference voltage line RVL, and the source node of the third transistor T3 may be electrically connected to the second node N2 of the driving transistor T1. Alternatively, the source node of the third transistor T3 may be electrically connected to the reference voltage line RVL, and the drain node of the third transistor T3 may be electrically connected to the second node N2 of the driving transistor T1.

The third transistor T3 may be turned on, e.g., in a display driving time period and be turned on in a sensing driving time period for sensing the characteristic values of the driving transistor T1 or the characteristic values of the light emitting device (LED).

The third transistor T3 may be turned on by the second scan signal SCAN2 in accordance with the driving timing (e.g., the display driving timing or an initialization timing within the sensing driving time period). The third transistor T3 turned on by the second scan signal SCAN2 may transfer the reference voltage Vref supplied to the reference voltage line RVL to the second node N2 of the driving transistor T1.

The third transistor T3 may be turned on by the second scan signal SCAN2 in accordance with the driving timing (e.g., a sampling timing within the sensing driving time period). The third transistor T3 turned on by the second scan signal SCAN2 may transfer the voltage of the second node N2 of the driving transistor T1 to the reference voltage line RVL.

Accordingly, the third transistor T3 may control the voltage state of the second node N2 of the driving transistor T1 or may transfer the voltage of the second node N2 of the driving transistor T1 to the reference voltage line RVL.

The reference voltage line RVL may be electrically connected with an analog-to-digital converter that senses the voltage of the reference voltage line RVL, converts the voltage into a digital value, and outputs sensing data including the digital value.

The analog-to-digital converter may be included in the source driver integrated circuit (SDIC) that implements the data driver DDR.

The sensing data output from the analog-to-digital converter may be used to sense the characteristic values (e.g., threshold voltage or mobility) of the driving transistor T1 or the characteristic values (e.g., threshold voltage) of the light emitting device (LED).

Each of the driving transistor T1, the second transistor T2, and the third transistor T3 may be an n-type transistor or a p-type transistor.

The first scan signal SCAN1 and the second scan signal SCAN2 may be separate gate signals. In this case, the first scan signal SCAN1 and the second scan signal SCAN2, respectively, may be applied to the gate node of the second transistor T2 and the gate node of the third transistor T3 through different gate lines.

In some cases, the first scan signal SCAN1 and the second scan signal SCAN2 may be the same gate signals. In this case, the first scan signal SCAN1 and the second scan signal SCAN2 may be jointly applied to the gate node of the second transistor T2 and the gate node of the third transistor T3 through the same gate line.

The structure of each subpixel illustrated in FIG. 2 is merely an example for description, and may further include one or more transistors or, in some cases, one or more storage capacitors.

The plurality of subpixels may have the same structure, or some of the plurality of subpixels may have a different structure.

Figure 3:
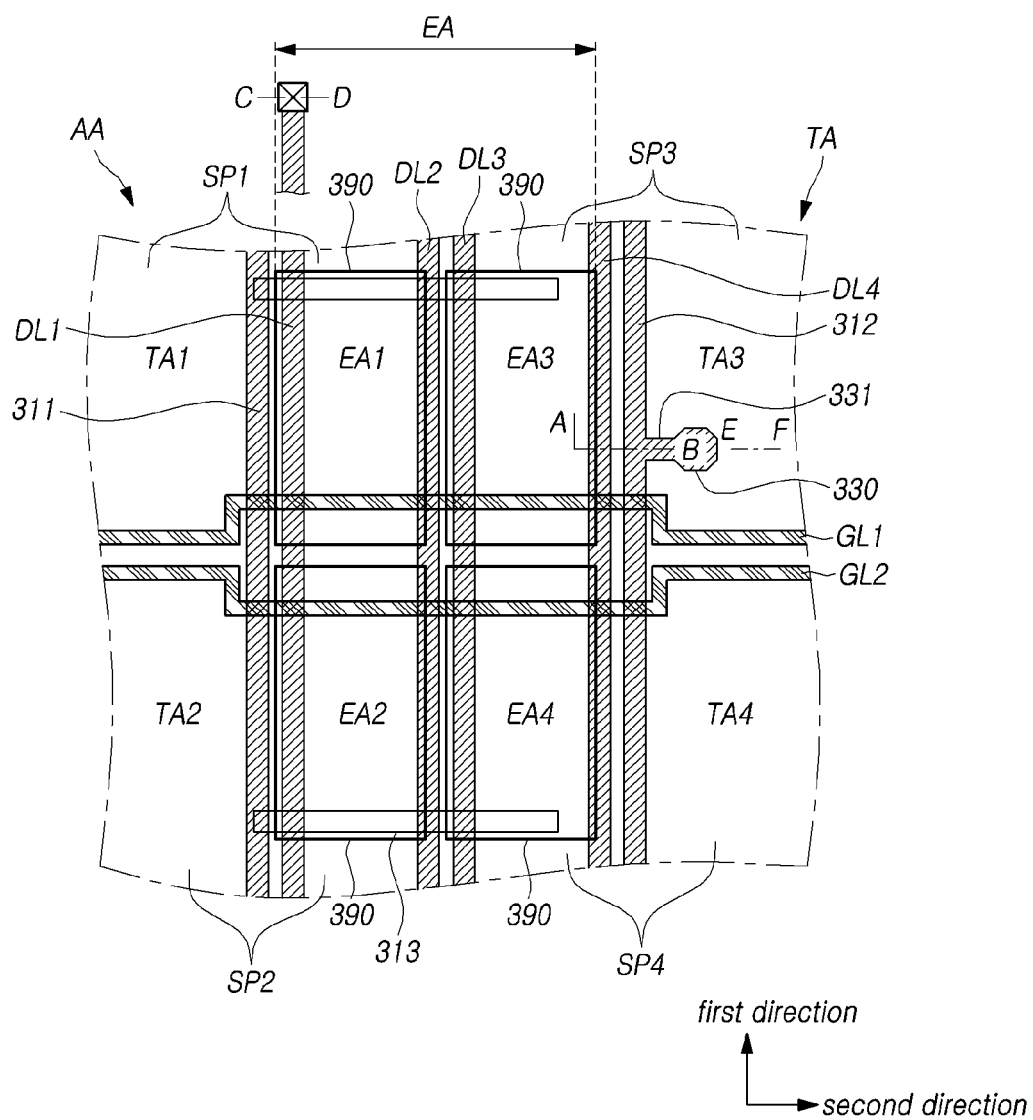
FIG. 3 is a plan view illustrating a partial area of an electroluminescent display device according to aspects of the disclosure.

FIG. 3 is a plan view illustrating a partial area of an electroluminescent display device according to aspects of the disclosure.

Referring to FIG. 3, according to aspects of the disclosure, a plurality of subpixels SP1, SP2, SP3, and SP4 may be disposed in the active area AA of the electroluminescent display device 100. Each of the subpixels SP1, SP2, SP3, and SP4 may include at least one emission area and at least one transmission area.

For example, a first subpixel SP1 may include a first emission area EA1 and a first transmission area TA1, a second subpixel SP2 may include a second emission area EA2 and a second transmission area TA2, a third subpixel SP3 may include a third emission area EA3 and a third transmission area TA3, and a fourth subpixel SP4 may include a fourth emission area EA4 and a fourth transmission area TA4.

The first subpixel SP1, the second subpixel SP2, the third subpixel SP3, and the fourth subpixel SP4 may be included in one pixel, but the disclosure is not limited thereto. According to aspects of the disclosure, the electroluminescent display device 100 may have any structure in which one pixel includes two or more subpixels.

The first emission area EA1 may be an area emitting green light, the second emission area EA2 may be an area emitting blue light, the third emission area EA3 may be an area emitting white light, and the fourth emission area EA4 may be an area emitting red light, but aspects of the disclosure are not limited thereto.

At least two emission areas among the first to fourth emission areas EA1, EA2, EA3, and EA4 may be different in size from each other and, in some cases, the first to fourth emission areas EA1, EA2, EA3, and EA4 may have the same size.

According to aspects of the disclosure, the electroluminescent display device 100 may include a plurality of signal lines.

Specifically, the electroluminescent display device 100 may include a first voltage line 311 extending in a first direction, first to fourth data lines DL1, DL2, DL3, and DL4, and a second voltage line 312. The first voltage line 311 may be a driving voltage line DVL supplying a driving voltage, and the second voltage line 312 may be a power supply line to which a base voltage or a low potential power voltage is applied.

The electroluminescent display device 100 may include at least one connection line 313 electrically connected to the first voltage line 311, and the connection line 313 may extend in a second direction crossing the first direction. The connection line 313 may be electrically connected to the driving transistor disposed in each subpixel.

The electroluminescent display device 100 may include first and second gate lines GL1 and GL2 extending in the second direction.

Each of the signal lines may be connected to the pad electrode of the pad area disposed in the non-active area.

The first voltage line 311, the first to fourth data lines DL1, DL2, DL3, and DL4, and the second voltage line 312 may be disposed on a layer different from the first and second gate lines GL1 and GL2.

Although not shown in FIG. 3, the electroluminescent display device 100 may further include a reference voltage line extending in the first direction.

The arrangement of the plurality of signal lines illustrated in FIG. 3 is merely an example, and the plurality of data lines, the plurality of gate lines, the first voltage line 311, the second voltage line 312 and the reference voltage line may be arranged in other various ways.

A plurality of emission areas EA may be disposed between the first voltage line 311 and the second voltage line 312.

For example, at least one first emission area EA1, at least one second emission area EA2, at least one third emission area EA3, and at least one fourth emission area EA4 may be disposed between one first voltage line 311 and one second voltage line 312, but aspects of the disclosure are not limited thereto.

For example, the first emission area EA1 and the second emission area EA2 may overlap a portion of the first voltage line 311, and the third emission area EA3 and the fourth emission area EA4 may overlap a portion of the second voltage line 312.

In some cases, the plurality of emission areas EA1, EA2, EA3, and EA4 may be disposed between the first to fourth data lines DL1, DL2, DL3, and DL4 disposed between one first voltage line 311 and one second voltage line 312.

For example, the first emission area EA1 and the second emission area EA2 spaced apart from each other may be disposed between the first data line D1 and the second data line D2, and the third emission area EA3 and the fourth emission area EA4 spaced apart from each other may be disposed between the third data line D3 and the fourth data line D4. However, aspects of the disclosure are not limited thereto.

Each of the first and second emission areas EA1 and EA2 may overlap the first and second data lines DL1 and DL2, and each of the third and fourth emission areas EA3 and EA4 may overlap the third and fourth data lines DL3 and DL4.

The first emission area EA1 and the second emission area EA2 may be arranged in the first direction, and the third emission area EA3 and the fourth emission area EA4 may also be arranged in the first direction.

Although not illustrated in the drawings, a plurality of transistors, at least one storage capacitor, and a light emitting device may be disposed in an area overlapping each of the first to fourth emission areas EA1, EA2, EA3, and EA4.

For example, the driving transistor T1, the second transistor T2, and the third transistor T3 described in connection with FIG. 2 and one storage capacitor Cst may be disposed in each of the first to fourth emission areas EA1, EA2, EA3, and EA4.

Transmission areas TA may be disposed on one side of the first voltage line 311 and one side of the second voltage line 312.

For example, a first transmission area TA1 and a second transmission area TA2 may be disposed on one side of the first voltage line 311. A third transmission area TA3 and a fourth transmission area TA4 may be disposed on one side of the second voltage line 312.

The first transmission area TA1 and the second transmission area TA2 may be arranged in the first direction, and the third transmission area TA3 and the fourth transmission area TA4 may also be arranged in the first direction.

The electroluminescent display may come in a type of top emission, bottom emission, or dual emission. Whichever emission type is adopted, a large-scale display panel may cause a voltage drop (IR drop) in the cathode electrodes of the light emitting devices if the cathode electrodes are disposed in a large area.

In particular, if the cathode electrode may include a transparent conductive material, e.g., indium tin oxide (ITO), indium zinc oxide (IZO), or indium gallium zinc oxide (IGZO), the resistance of the cathode electrode increases. Thus, a significant voltage drop occurs, causing a reduction in luminance at the central portion as compared with the edges of the display panel.

According to aspects of the disclosure, the electroluminescent display device 100 may include an auxiliary electrode 330 in contact with the cathode electrode of the light emitting device, preventing the reduction in luminance at the central portion of the display panel due to the voltage drop by the cathode electrode.

The auxiliary electrode 330 may be connected to an auxiliary line 331 branched from the second voltage line 312. 1.

The cathode electrode of the light emitting device may be in contact with a portion of the upper surface of the auxiliary electrode 330. Accordingly, the resistance of the cathode electrode of the light emitting device may be reduced.

Although FIG. 3 illustrates a structure in which one auxiliary electrode 330 is disposed per four subpixels (per pixel), according to aspects of the disclosure, the structure of the electroluminescent display device 100 is not limited thereto. For example, one auxiliary electrode 330 may be disposed per 8 or more subpixels.

According to aspects of the disclosure, the auxiliary electrode 330 of the electroluminescent display device 100 and the portion of the auxiliary line 331 connected to the auxiliary electrode 330 may be disposed in the transmission area TA. For example, as illustrated in FIG. 3, the auxiliary line 331 may overlap a portion of the third transmission area TA3 disposed on one side of the second voltage line 312.

Since the proportion of the auxiliary line 331 and the auxiliary electrode 330 occupying the third transmission area TA3 is very small, the transmittance of the third transmission area TA3 may not be affected by the auxiliary line 331 and the auxiliary electrode 330.

The light emitting device may include an anode electrode 390 (or a first electrode), a light emitting layer 495, and a cathode electrode (or a second electrode) 497. The cathode electrode 497 of the light emitting device may contact the upper surface of the auxiliary electrode 330 and be thus electrically connected to the auxiliary electrode 330. Accordingly, it is possible to prevent the cathode electrode from failing to contact the auxiliary electrode 330 as the upper surface of the auxiliary electrode 330 is covered by the light emitting layer disposed under the cathode electrode.

After the light emitting layer of the light emitting device is formed, the upper surface of the auxiliary electrode 330 need be exposed so that the upper surface of the auxiliary electrode 330 and the cathode electrode may be connected. As such, to prevent the upper surface of the auxiliary electrode 330 from being covered by the light emitting layer, an inversely tapered barrier rib may be disposed on the auxiliary electrode 330.

However, due to difficulty in forming such an inversely tapered barrier rib and a low adhesive between the barrier rib and the auxiliary electrode 330, the barrier rib may be separated from the upper surface of the auxiliary electrode 330 or the barrier rib may collapse. If a defect occurs in the barrier rib, the light emitting layer may cover the upper surface of the auxiliary electrode 330, causing the cathode electrode 330 to fail to stay in contact with the upper surface of the auxiliary electrode 330. Accordingly, it may be hard to connect the auxiliary electrode 330 and the cathode electrode.

According to aspects of the disclosure, the electroluminescent display device 100 prevents the light emitting layer from being disposed on a portion of the upper surface of the auxiliary electrode 330 by way of an arrangement of the insulation films on the substrate, instead of forming a barrier rib on the auxiliary electrode 330. As the portion of the upper surface of the auxiliary electrode 330, where the light emitting layer is not disposed, may contact the cathode electrode, it may be prevented from a voltage drop in the cathode electrode.

According to aspects of the disclosure, an arrangement of the auxiliary electrode 330 of the electroluminescent display device 100 and components disposed on the auxiliary electrode is discussed below.

Figure 4:
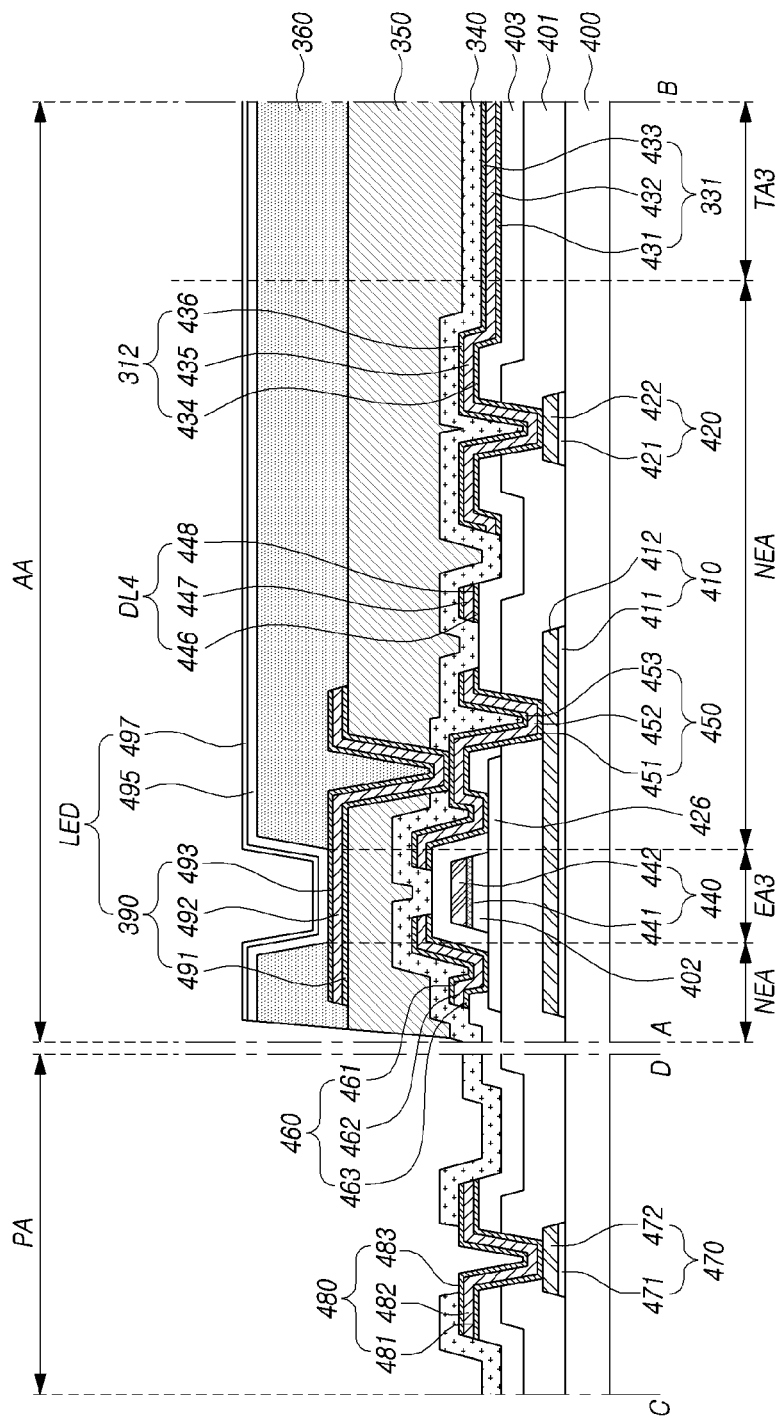
FIG. 4 is a cross-sectional view taken along line A-B and line C-D of FIG. 3.

FIG. 4 is a cross-sectional view taken along line A-B and line C-D of FIG. 3.

A-B of FIG. 3 is a line along which a portion of the third emission area EA3 and the third transmission area TA3 disposed in the active area is cut, and C-D of FIG. 3 is a line along which the pad electrode disposed in the pad area of the non-active area is cut.

Referring to FIG. 4, the active area AA may include a third emission area EA3 and a third transmission area TA1.

As illustrated in FIG. 4, a non-emission area may exist between the third emission area EA3 and the third transmission area TA3.

A transistor and a light emitting device LED may be disposed in the third emission area EA3. A portion of the auxiliary line 331 may be disposed in the third transmission area TA3.

The non-active area may include a pad area PA, and pad electrodes 470 and 480 may be disposed in the pad area PA.

The structure of the active area AA is described below in detail.

A light blocking layer 410 and a third voltage line 420 may be disposed on the substrate 400.

The light blocking layer 410 may serve to block light from being incident on the active layer 426 of the transistor, and the third voltage line 420 may serve to apply a low voltage to the cathode electrode of the light emitting device (LED), The light blocking layer 410 and the third voltage line 420 may be disposed on the same layer and may include the same material.

Specifically, the light blocking layer 410 may include a lower light blocking layer 411 disposed on the substrate 400 and an upper light blocking layer 412 disposed on the lower light blocking layer 411.

The third voltage line 420 may include a first lower voltage line 421 disposed on the substrate 400 and a first upper voltage line 422 disposed on the first lower voltage line 421.

The lower light blocking layer 411 and the first lower voltage line 421 may include the same material, and the upper light blocking layer 412 and the first upper voltage line 422 may include the same material. The lower light blocking layer 411, the upper light blocking layer 412, the first lower voltage line 421, and the first upper voltage line 422 may include, but are not limited to, any one of aluminum (Al), gold (Au), silver (Ag), copper (Cu), tungsten (W), molybdenum (Mo), chromium (Cr), tantalum (Ta), titanium (Ti), or alloys thereof.

Although FIG. 4 illustrates a structure in which the light blocking layer 410 and the third voltage line 420 have a double layer structure, aspects of the disclosure are not limited thereto. For example, the light blocking layer 410 and the third voltage line 420 may be formed of a single layer or a structure of three or more layers.

A buffer layer 401 may be disposed on the light blocking layer 410 and the third voltage line 420. The buffer layer 401 may be disposed in the third emission area EA3 and the third transmission area TA3.

The buffer layer 401 may include an inorganic insulating material, such as silicon oxide (SiOx), silicon nitride (SiNx), or silicon oxynitride (SiOxNy), but the disclosure is not limited thereto.

A transistor including an active layer 426, a gate electrode 440, a source electrode 450, and a drain electrode 460 may be disposed on the buffer layer 401. The transistor disposed on the buffer layer 401 may be the driving transistor T1 illustrated in FIG. 2.

The active layer 426 may be formed on the buffer layer 401.

The active layer 426 may be formed of a silicon-based semiconductor material or an oxide-based semiconductor material.

A gate insulation film 402 may be disposed on the active layer 426. Specifically, the gate insulation film 402 may be disposed on a portion of the upper surface of the active layer 426.

The gate insulation film 402 may include an inorganic insulating material, such as silicon oxide (SiOx), silicon nitride (SiNx), or silicon oxynitride (SiOxNy), but the disclosure is not limited thereto.

A gate electrode 440 may be disposed on the gate insulation film 402.

The gate electrode 440 may include a lower gate electrode 441 disposed on the gate insulation film 402 and an upper gate electrode 442 disposed on the lower gate electrode 441.

The lower gate electrode 441 and the upper gate electrode 442 may include any one of metals, such as aluminum (Al), gold (Au), silver (Ag), copper (Cu), tungsten (W), molybdenum (Mo), chromium (Cr), tantalum (Ta), and titanium (Ti), or alloys thereof, but the disclosure is not limited thereto.

An inter-layer insulation film 403 may be disposed on the substrate on which the gate electrode 440 is disposed. The inter-layer insulation film 403 may be disposed in the third emission area EA3 and the third transmission area TA3.

The inter-layer insulation film 403 may include an inorganic insulating material, such as silicon oxide (SiOx), silicon nitride (SiNx), or silicon oxynitride (SiOxNy), but the disclosure is not limited thereto.

The source electrode 450 and drain electrode 460 of the transistor may be disposed on the inter-layer insulation film 403 and may be spaced apart from each other.

Each of the source electrode 450 and the drain electrode 460 may contact a portion of the upper surface of the active layer 426 through a contact hole provided in the inter-layer insulation film 403.

The source electrode 450 may contact a portion of the upper surface of the light blocking layer 410 through another contact hole provided in the inter-layer insulation film 403 and the buffer layer 401. In other words, the source electrode 450 and the light blocking layer 410 may be electrically connected.

When the light blocking layer 410 including the conductive material is in a floating state, the threshold voltage of the transistor overlapping the light blocking layer 410 may be changed, so that the transistor may malfunction. According to an aspect of the disclosure, as the electrode 450 and the light blocking layer 410 are electrically connected with each other, a malfunction of the transistor overlapping the light blocking layer 410 may be prevented.

The source electrode 450 of the transistor may include a first source electrode 451 disposed on the inter-layer insulation film 403, a second source electrode 452 disposed on the first source electrode 451, and a third source electrode 453 disposed on the second source electrode 452.

The drain electrode 460 of the transistor may include a first drain electrode 461 disposed on the inter-layer insulation film 403, a second drain electrode 462 disposed on the first drain electrode 461, and a third drain electrode 463 disposed on the second drain electrode 462.

A fourth data line DL4 spaced apart from the source electrode 450 and the drain electrode 460 of the transistor may be disposed on the inter-layer insulation film 403.

The fourth data line DL4 may include a lower data line 446 disposed on the inter-layer insulation film 403, an upper data line 447 disposed on the lower data line 446, and a cover data line 448 disposed on the upper data line 447.

A second voltage line 312 spaced apart from the fourth data line DL4 may be disposed on the inter-layer insulation film 403.

The second voltage line 312 may overlap the third voltage line 420. The second voltage line 312 may be electrically connected to the third voltage line 420 through the contact hole provided in the inter-layer insulation film 403 and the buffer layer 401.

The second voltage line 312 may include a second lower voltage line 434 disposed on the inter-layer insulation film 403, a second upper voltage line 435 disposed on the second lower voltage line 434, and a cover voltage line 436 disposed on the second upper voltage line 435.

An auxiliary line 331 integrated with the second voltage line 312 may be disposed in a partial area of the third transmission area TA3.

The auxiliary line 331 may be disposed not only in the third transmission area TA3 but also in a portion of the third emission area EA3. If a non-emission area is disposed between the third emission area EA3 and the third transmission area TA3, the auxiliary line 331 may also be disposed in the non-emission area between the third emission area EA3 and the third transmission area TA3.

The auxiliary line 331 may include a first auxiliary line 431 integrated with the second lower voltage line 434 of the second voltage line 312, a second auxiliary line 432 integrated with the second upper voltage line 435 of the second voltage line 312, and a third auxiliary line 433 integrated with the cover voltage line 436.

The source electrode 450, the drain electrode 460, the fourth data line DL4, the second voltage line 312, and the auxiliary line 331 each may include, but are not limited to, any one of aluminum (Al), gold (Au), silver (Ag), copper (Cu), tungsten (W), molybdenum (Mo), chromium (Cr), tantalum (Ta), titanium (Ti), or alloys thereof.

Although FIG. 4 illustrates a structure in which each of the source electrode 450, the drain electrode 460, the fourth data line DL4, the second voltage line 312, and the auxiliary line 331 has a triple-layer structure, the disclosure is not limited thereto. For example, each of the source electrode 450, the drain electrode 460, the fourth data line DL4, the second voltage line 312, and the auxiliary line 331 may have a single-layer, double-layer, or quadruple-layer structure or a structure of more layers.

A first insulation film 340 may be disposed on the substrate 400 on which the source electrode 450, the drain electrode 460, the fourth data line DL4, the second voltage line 312, and the auxiliary line 331 are disposed.

The first insulation film 340 may be disposed in the third emission area EA3 and the third transmission area TA3.

The first insulation film 340 may include an inorganic insulating material, such as silicon oxide (SiOx), silicon nitride (SiNx), or silicon oxynitride (SiOxNy).

A second insulation film 350 may be disposed on the first insulation film 340.

The second insulation film 350 may be disposed in the third emission area EA3 and the third transmission area TA3.

The second insulation film 350 may be formed of an insulating material, such as acrylic resin, epoxy resin, phenolic resin, polyamide resin, or polyimide resin, but aspects of the disclosure are not limited thereto.

A first electrode 490 (anode electrode) of the light emitting device LED may be disposed on a portion of the upper surface of the second insulation film 350 in the third emission area EA3.

The first electrode 390 may include a lower electrode 491 disposed on the second insulation film 350, an upper electrode 492 disposed on the lower electrode 491, and a cover electrode 493 disposed on the upper electrode 492.

The lower electrode 491 and the cover electrode 493 of the first electrode 390 may include a transparent conductive material. For example, each of the lower electrode 491 and the cover electrode 493 may include any one of ITO, IZO, and IGZO, but aspects of the disclosure are not limited thereto.

The upper electrode 492 of the first electrode 390 may include a reflective material. For example, the upper electrode 492 may be formed of silver (Ag), aluminum (Al), copper (Cu), nickel (Ni), palladium (Pd), or an alloy thereof, but aspects of the disclosure are not limited thereto.

A bank 360 may be disposed on a portion of the upper surface of the first electrode 390 of the light emitting device LED and the second insulation film 350.

The bank 360 may define an emission area and a non-emission area in the active area AA, but not in the transmission area, and the area in which the bank 360 is disposed may be a non-emission area, and the area in which the bank 360 is not disposed may be an emission area.

The bank 360 may be formed of an organic insulating material, such as polyimide resin, acryl resin, or benzocyclobutene (BCB), but aspects of the disclosure are not limited thereto.

The light emitting layer 495 of the light emitting device LED may be disposed on the bank 360 and the first electrode 390.

Although FIG. 4 illustrates a structure in which the light emitting layer 495 is a single layer, aspects of the disclosure are not limited thereto, but the light emitting layer 495 may be formed in a multi-layer structure.

A second electrode 497 (cathode electrode) of the light emitting device (LED) may be disposed on the light emitting layer 495.

The second electrode 497 may include a transparent conductive material. For example, the second electrode 497 may include any one of ITO, IZO, and IGZO, but aspects of the disclosure are not limited thereto.

As described above, since the first electrode 390 of the light emitting device (LED) includes an electrode including a reflective material and the second electrode 497 includes a transparent conductive material, the light emitted from the light emitting layer 495 of the light emitting device LED may be directed toward the second electrode 497. According to aspects of the disclosure, the electroluminescent display device 100 may be a top emission-type electroluminescent display device.

As described above, according to aspects of the disclosure, although a top emission-type electroluminescent display device 100 is primarily described herein, aspects of the disclosure are not limited thereto, but may rather be applied to all other types of display devices to prevent a voltage drop in the cathode electrode.

The light emitting layer 495 and the second electrode 497 of the light emitting device (LED) may be disposed in the emission area and non-emission area of the active area AA of the electroluminescent display device 100 and may also be disposed in a portion of the transmission area.

Although the description in connection with FIG. 4 focuses primarily on the structure of the third emission area EA3, the non-emission area NEA surrounding the third emission area EA3, and the third transmission area TA3 adjacent to the third emission area EA3, the structure of the third emission area EA, the non-emission area, and the third transmission area TA3 may be applied to other emission areas, non-emission areas, and transmission areas of the electroluminescent display device 100 according to aspects of the disclosure.

Pad electrodes 470 and 480 may be disposed in the pad area PA disposed in the non-active area of the electroluminescent display device 100.

Specifically, a first pad electrode 470 may be disposed on the substrate 400.

The first pad electrode 470 may be disposed on the same layer as the light blocking layer 410 and the third voltage line 420 disposed in the active area AA.

The first pad electrode 470 may include a first lower pad electrode 471 and a first upper pad electrode 472 disposed on the first lower pad electrode 471.

The first lower pad electrode 471 and the first upper pad electrode 472 each may include any one of metals, such as aluminum (Al), gold (Au), silver (Ag), copper (Cu), tungsten (W), molybdenum (Mo), chromium (Cr), tantalum (Ta), and titanium (Ti), or alloys thereof, but the disclosure is not limited thereto.

A buffer layer 401 may be disposed on the first pad electrode 470.

An inter-layer insulation film 403 may be disposed on the buffer layer 401.

A second pad electrode 480 may be disposed on the inter-layer insulation film 403.

The second pad electrode 480 may be disposed on the same layer as the source electrode 450, the drain electrode 460, the fourth data line DL4, the second voltage line 312, and the auxiliary line 331 disposed in the active area AA.

The second pad electrode 480 may include a second lower pad electrode 481 disposed on the inter-layer insulation film 403, a second upper pad electrode 482 disposed on the second lower pad electrode 481, and a cover pad electrode 483 disposed on the second upper pad electrode 482.

The second lower pad electrode 481, the second upper pad electrode 482, and the cover pad electrode 483 each may include any one of metals, such as aluminum (Al), gold (Au), silver (Ag), copper (Cu), tungsten (W), molybdenum (Mo), chromium (Cr), tantalum (Ta), and titanium (Ti), or alloys thereof, but the disclosure is not limited thereto.

The second pad electrode 480 may be electrically connected to the first pad electrode 470 through a contact hole provided in the inter-layer insulation film 403 and the buffer layer 401.

A first insulation film 340 may be disposed on the second pad electrode 480.

The first insulation film 340 may include a contact hole exposing a portion of the upper surface of the second pad electrode 480.

The second pad electrode 480 may be electrically connected to an external circuit (such as a printed circuit board or a circuit film) through the contact hole provided in the first insulation film 340.

Although FIG. 4 illustrates a structure in which the auxiliary line 313 is disposed in a portion of the third transmission area TA3, according to aspects of the disclosure, a plurality of transmission areas of the electroluminescent display device 100 may include an area where the auxiliary line 313 is not disposed.

This is described below with reference to FIG. 5.

Figure 5:
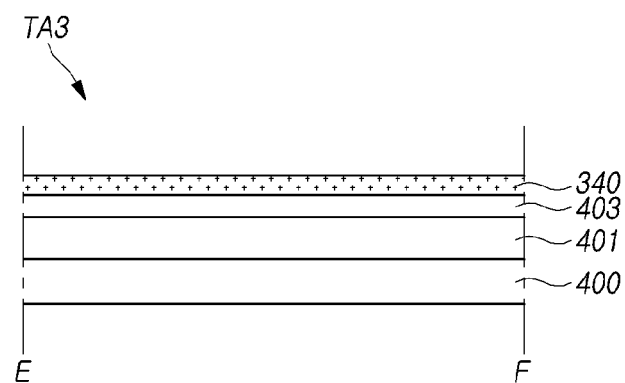
FIG. 5 is a cross-sectional view taken along line E-F of FIG. 3.

FIG. 5 is a cross-sectional view taken along line E-F of FIG. 3.

Substantially the same configurations and effects as those described above are not repeatedly described below. In the following description, the same reference numbers may be used to denote the same elements or components as those described in the above aspects.

Referring to FIG. 5, according to aspects of the disclosure, a third transmission area TA3 of an electroluminescent display device 100 may include an area in which there are disposed a buffer layer 401 disposed on a substrate 400, an inter-layer insulation film 403 disposed on the buffer layer 401, and a first insulation film 340 disposed on the inter-layer insulation film 403.

In other words, the third transmission area TA3 may include an area in which components (e.g., a plurality of electrodes and lines) which may reduce the transmittance of the third transmission area TA3 are not disposed.

Although FIG. 5 illustrates a structure in which insulation films containing an inorganic insulating material are disposed on the substrate 400, aspects of the disclosure are not limited thereto, and an insulation film containing an organic insulating material that does not reduce the transmittance may further be disposed.

In other words, as illustrated in FIG. 3, the third transmission area TA3 may include an area in which at least one layer of insulation film is disposed on the substrate 400, as well as the area in which the auxiliary line 331 and the auxiliary electrode 330 integrated with the auxiliary line 331 are disposed.

According to aspects of the disclosure, the electroluminescent display device 100 may include a transmission area (e.g., the first, second, and fourth transmission areas TA1, TA2, and TA4 of FIG. 3) in which the auxiliary line 331 and the auxiliary electrode 330 are not disposed.

A first insulation film 340, a second insulation film 350, a bank 360, a light emitting layer 495 of a light emitting device LED, a second insulation film 350, and an electrode pattern may be disposed on a portion of the upper surface of the auxiliary electrode 330 disposed in the third transmission area TA3.

This is discussed below with reference to FIGS. 6 to 11.

Figure 6:
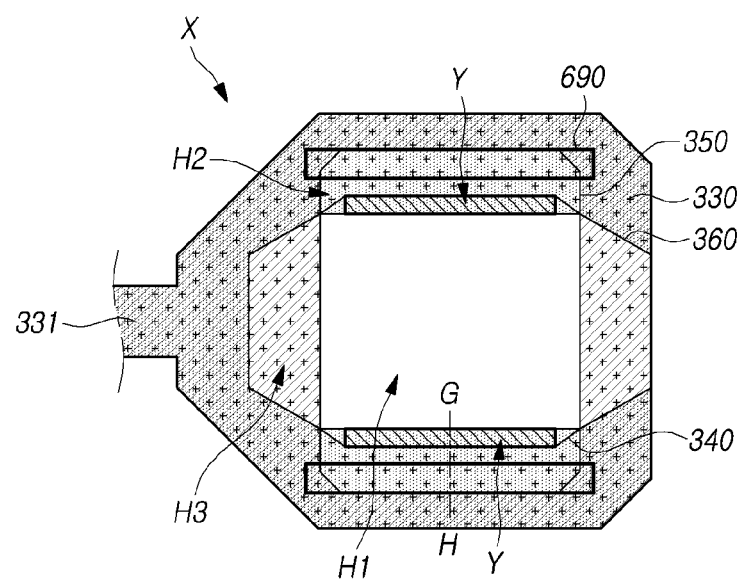
FIG. 6 is an enlarged view of area X of FIG. 3.

FIG. 6 is an enlarged view of area X of FIG. 3.

Substantially the same configurations and effects as those described above are not repeatedly described below. In the following description, the same reference numbers may be used to denote the same elements or components as those described in the above aspects.

Referring to FIG. 6, the first insulation film 340, the second insulation film 350, the bank 360, the light emitting layer of the light emitting device LED, the second electrode, and the electrode pattern 690 may be disposed on the auxiliary electrode 330 disposed in a partial area of the third transmission area TA3.

Specifically, the first insulation film 340 may be disposed on a portion of the upper surface of the auxiliary electrode 330 integrated with the auxiliary line 331.

The first insulation film 340 may include a first hole H1 exposing a portion of the upper surface of the auxiliary electrode 330. In other words, in the area where the first hole H1 of the first insulation film 340 is formed, the first insulation film 340 and the auxiliary electrode 330 may not overlap.

The second insulation film 350 having a second hole H2 overlapping the first hole H1 of the first insulation film 340 may be disposed on the auxiliary electrode 330. The second insulation film 350 may expose a portion of the upper surface of the auxiliary electrode 330 through the second hole H2.

In plan view, the area of the second hole H2 of the second insulation film 350 may be larger than the area of the first hole H1 of the first insulation film 340. Accordingly, the second hole H2 of the second insulation film 350 may also expose the portion of the upper surface of the first insulation film 340.

In other words, in the area where the second hole H2 of the second insulation film 350 is formed, the second insulation film 350 and the first insulation film 340 may not overlap.

An electrode pattern 690 overlapping a portion of the upper surface of the first insulation film 340 may be disposed on the auxiliary electrode 330.

A portion of a side surface of the electrode pattern 690 may contact the second insulation film 350. The electrode pattern 690 and the second insulation film 350 may be disposed to expose a portion of the upper surface of the first insulation film 340 adjacent to the first hole H1.

The bank 360, which overlaps the first insulation film 340, the second insulation film 350, and the electrode pattern 690 may overlap a portion of the first hole H1 of the first insulation film 340 and a portion of the second hole H2 of the second insulation film 350, may be disposed on the auxiliary electrode 330.

The bank 360 may include a third hole H3 exposing a portion of the upper surface of the auxiliary electrode 330. The third hole H3 of the bank 360 may overlap a portion of the first hole of the first insulation film 340 and may also overlap a portion of the second hole H2 of the second insulation film 350.

The bank 360 may overlap a portion of the upper surface of the auxiliary electrode 330, which overlaps the first hole H1 of the first insulation film 340 and the second hole H2 of the second insulation film 350.

Although not illustrated in FIG. 6, the light emitting layer of the light emitting device LED and the second electrode may be disposed on the bank 360. In the area where the first hole is disposed, the light emitting layer of the light emitting device LED and the second electrode may also be disposed on a portion of the upper surface of the auxiliary electrode 330.

The light emitting layer of the light emitting device LED may not be disposed in the area (area Y of FIG. 6) in which the upper surface of the auxiliary electrode 330 overlaps the bank 360, of the area having the first hole H1 of the first insulation film 340.

Among the areas in which the first holes H1 of the first insulation film 340 are disposed, a light emitting device (LED) is partially disposed in an area (Y area in FIG. 6) where the upper surface of the auxiliary electrode 330 and the bank 360 overlap. By disposing the second electrode of the light emitting device (LED), the second electrode of the LED and the upper surface of the auxiliary electrode 330 may be in contact.

This structure is discussed below in detail with reference to FIG. 7.

Figure 7:
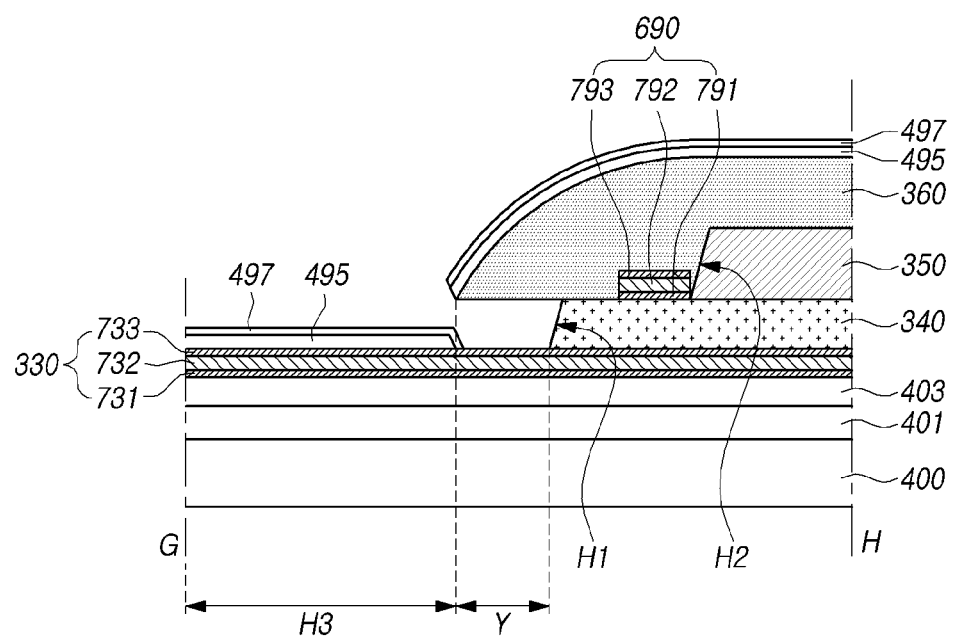
FIG. 7 is a cross-sectional view taken along line G-H of FIG. 6.

FIG. 7 is a cross-sectional view taken along line G-H of FIG. 6.

Referring to FIG. 7, a buffer layer 401 and an inter-layer insulation film 403 may be disposed on a substrate 400, and an auxiliary electrode 330 may be disposed on the inter-layer insulation film 403.

The auxiliary electrode 330 may include a first auxiliary electrode 731 disposed on the inter-layer insulation film 403, a second auxiliary electrode 732 disposed on the first auxiliary electrode 731, and a third auxiliary electrode 733 disposed on the second auxiliary electrode 732.

The auxiliary electrode 330 may be disposed on the same layer as the source electrode 450, the drain electrode 460, the fourth data line DL4, the second voltage line 312, the auxiliary line 331 and the second pad electrode 480 illustrated in FIG. 4.

A first insulation film 340 may be disposed on a portion of the upper surface of the auxiliary electrode 330.

The first insulation film 340 may include a first hole H1 exposing a portion of the upper surface of the auxiliary electrode 330.

An electrode pattern 690 and a second insulation film 350 may be disposed on a portion of the upper surface of the first insulation film 340.

The electrode pattern 690 may include a first electrode pattern 791 disposed on the first insulation film 340, a second electrode pattern 792 disposed on the first electrode pattern 791, and a third electrode pattern 793 disposed on the second electrode pattern 792.

The electrode pattern 690 may be formed by the same process as that of the first electrode of the light emitting device (LED).

The first electrode pattern 791 and the third electrode pattern 793 of the electrode pattern 690 may include a transparent conductive material. For example, each of the first electrode 791 and the third electrode pattern 793 may include any one of ITO, IZO, and IGZO, but aspects of the disclosure are not limited thereto.

The second electrode pattern 792 of the electrode pattern 690 may include a reflective material. For example, the upper electrode 492 may be formed of silver (Ag), aluminum (Al), copper (Cu), nickel (Ni), palladium (Pd), or an alloy thereof, but aspects of the disclosure are not limited thereto.

The angle between a side surface of the electrode pattern 690 and the surface of the first insulation film 340 may be 90 degrees, but aspects of the disclosure are not limited thereto and, depending on processing conditions, the angle between the side surface of the electrode pattern 690 and the surface of the first insulation film 340 may be smaller than 90 degrees.

The electrode pattern 690 may not overlap the first hole H1 of the first insulation film 340. In other words, the electrode pattern 690 may not overlap the auxiliary electrode 330 overlapping the first hole H1 of the first insulation film 340.

If the electrode pattern 690 overlaps the auxiliary electrode 330 in the first hole H1 of the first insulation film 340, damage to the electrode pattern 690 or other defects may occur due to a potential difference (e.g., static electricity) between the electrode pattern 690 and the auxiliary electrode 330.

However, according to aspects of the disclosure, in the electroluminescent display device 100, as the electrode pattern 690 does not overlap the auxiliary electrode 330 overlapping the first hole H1 of the first insulation film 340, the electrode pattern 690 may be prevented from damage due to an occurrence of a potential difference. Referring to FIG. 7, two opposite ends of the electrode pattern 690 are disposed on the upper surface of the first insulation film 340. Accordingly, the end of the electrode pattern 690 is located further inside the side surface of the first insulation film 340.

The second insulation film 350 may include a second hole H2 overlapping the first hole H1 of the first insulation film 340 and exposing a portion of the upper surface of the first insulation film 340.

As described above, the electrode pattern 690 may be disposed on the first insulation film 340 and may be disposed in the second hole H2 of the second insulation film 350.

A portion of a side surface of the electrode pattern 690 may contact a portion of a side surface of the second insulation film 350. For example, a portion of a side surface of the first electrode pattern 791 may contact the portion of the side surface of the second insulation film 350.

A bank 360 may be disposed on the first insulation film 340 on which the second insulation film 350 and the electrode pattern 690 are disposed.

The bank 360 may overlap the second insulation film 350. The bank 360 may overlap the entire electrode pattern 690. Referring to FIG. 7, the lower surface of the electrode pattern 690 may be covered by the upper surface of the first insulation film 340, and one side surface and the upper surface of the electrode pattern 690 may be covered by the bank 360. A portion of the other side surface of the electrode pattern 690 may contact the side surface of the second insulation film 350. The bank 360 may be disposed in a space between the other side surface of the electrode pattern 690 and the side surface of the second insulation film 350. Accordingly, the other side surface of the electrode pattern 690 may be covered by the second insulation film 350 and the bank 360. Although not illustrated in the drawings, the entire other side surface of the electrode pattern 690 may be completely contacted by the second insulation film 350 and, thus, the entire other side surface of the electrode pattern 690 may be covered by the second insulation film 350.

The bank 360 may contact the upper surface of the first insulation film 340 in the second hole H2 of the second insulation film 350 which does not overlap the first hole H1 of the first insulation film 340.

The electrode pattern 690 may be disposed on the first insulation film 340, enhancing adhesion between the bank 360 and the electrode pattern 690. Thus, the bank 360 may be prevented from separating from the first insulation film 340.

As described above, in the electrode pattern 690, the second electrode pattern 792 may include a reflective material. If the reflective material is exposed, oxidation and denaturation may occur.

However, according to aspects of the disclosure, in the electroluminescent display device 100, the lower surface of the second electrode pattern 792 may be covered by the first electrode pattern 791, and the upper surface of the second electrode pattern 792 may be covered by the third electrode pattern 793. Further, as the side surface of the second electrode pattern 792 is covered by the bank 360, the second electrode pattern 792 may be prevented from oxidation and denaturation.

Although FIG. 7 illustrates a structure in which the electrode pattern 690 includes the first to third electrode patterns 791, 792, and 793, aspects of the disclosure are not limited thereto. For example, the electrode pattern 690 may be formed of a single layer, and the electrode pattern 690 formed of a single layer may include a transparent conductive material or a reflective material.

The bank 360 may be disposed to overlap a portion of the upper surface of the auxiliary electrode 330 overlapping the first hole H1 of the first insulation film 340.

Accordingly, the auxiliary electrode 330 may include an area that overlaps the bank 360 but does not overlap the first insulation film 340, the second insulation film 350, and the electrode pattern 690. In other words, in the area overlapping the bank 360 while not overlapping the first insulation film 340, the second insulation film 350, and the electrode pattern 690, the upper surface of the auxiliary electrode 330 may have a portion covered by the bank 360. The portion of the upper surface of the auxiliary electrode 330, covered by the bank 360, may correspond to area Y of FIG. 7.

As described above, with such a structure in which the first hole H1 of the first insulation film 340 overlaps the bank 360 in the area where the auxiliary electrode 330 is disposed, it is possible to implement an under-cut structure by way of the first insulation film 340 and the bank 360 without a separate barrier rib structure.

A light emitting layer 495 of a light emitting device (LED) may be disposed on the bank 360.

The light emitting layer 495 of the light emitting device (LED) may be formed by linear deposition or coating. For example, an organic layer 420 may be formed by evaporation.

Accordingly, the light emitting layer 495 may not be disposed in area Y where the upper surface of the auxiliary electrode 330 is covered by the bank 360. In other words, since the light emitting layer 495 formed by linear deposition may not spread to and deposit on the upper surface of the auxiliary electrode 330 covered by the bank 360, the light emitting layer 495 may not be disposed on the upper surface of the auxiliary electrode 330 overlapping the bank 360 in the first hole H1 of the first insulation film 340.

The light emitting layer 495 may be disposed on the upper surface of the auxiliary electrode 330, which does not overlap the bank 360, the second insulation film 350, and the first insulation film 340. In other words, the light emitting layer 495 may be disposed in an area corresponding to the third hole H3 of the bank 360.

The second electrode 497 of the light emitting device LED may be disposed on the light emitting layer 495.

The second electrode 497 may be formed by non-directional deposition or coating. For example, the second electrode 497 may be formed by sputtering. With superior step coverage, this method may easily form the second electrode 497 even in a stepped or under-cut structure.

Accordingly, the second electrode 497 may be disposed on the light emitting layer 495. The second electrode 497 may overlap the entire light emitting layer 495.

The second electrode 497 may also be disposed on a portion of the upper surface of the auxiliary electrode 330 in the area where the first hole H1 of the first insulation film 340 and the bank 360 overlap. The second electrode 497 may cover at least one side surface of the light emitting layer 495 disposed in the first hole H1 of the first insulation film 340.

In other words, the second electrode 497 contacts a portion of the upper surface of the auxiliary electrode 330 in the area where the first hole H1 of the first insulation film 340 and the bank 360 overlap, and the second electrode 497 may thus be electrically connected with the auxiliary electrode 330.

In other words, with a structure in which the bank 360 and the first hole H1 of the first insulation film 340 overlap, it is possible to implement an under-cut structure through the first insulation film 340 and the bank 360 without a separate barrier rib structure, thus creating an area in which the light emitting layer 495 is not disposed on the auxiliary electrode 330 and enabling the second electrode 497 and the auxiliary electrode 330 to contact each other in the area where the light emitting layer 495 is not disposed.

A structure of an electroluminescent display device according to another aspect of the disclosure is discussed below with reference to FIGS. 8 and 9.

Figure 8:
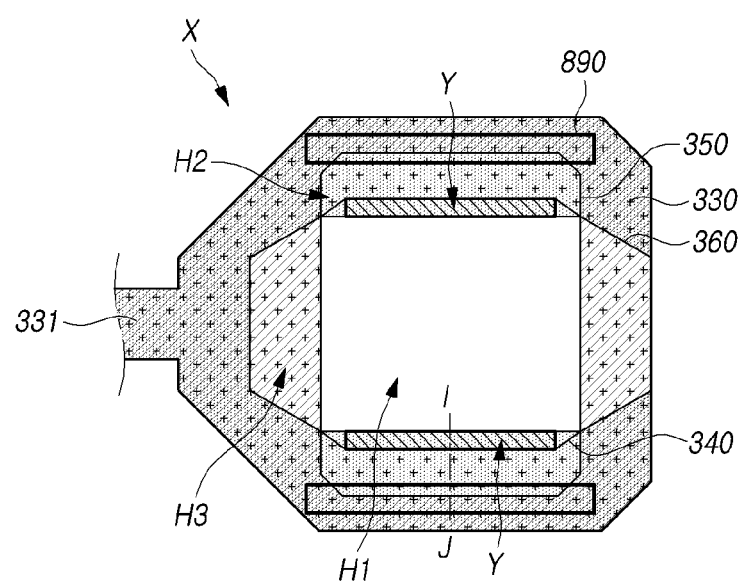
FIG. 8 is a view illustrating another aspect of area X of FIG. 3.

FIG. 8 is a view illustrating another aspect of area X of FIG. 3.

Substantially the same configurations and effects as those described above are not repeatedly described below. In the following description, the same reference numbers may be used to denote the same elements or components as those described in the above aspects.

Referring to FIG. 8, the first insulation film 340, the second insulation film 350, the bank 360, the light emitting layer of the light emitting device LED, the second electrode, and the electrode pattern 890 may be disposed on the auxiliary electrode 330 in a partial area of the third transmission area TA3.

A first insulation film 340 may be disposed on a portion of the upper surface of the auxiliary electrode 330. The first insulation film 340 may include a first hole H1 exposing a portion of the upper surface of the auxiliary electrode 330.

The second insulation film 350 having a second hole H2 overlapping the first hole H1 of the first insulation film 340 may be disposed on the auxiliary electrode 330.

An electrode pattern 890 overlapping a portion of the upper surface of the first insulation film 340 and overlapping a portion of the upper surface of the second insulation film 350 may be disposed on the auxiliary electrode 330.

The electrode pattern 890 and the second insulation film 350 may be disposed to expose a portion of the upper surface of the first insulation film 340 adjacent to the first hole H1.

The bank 360, which overlaps the first insulation film 340, the second insulation film 350, and the electrode pattern 890 may overlap a portion of the first hole H1 of the first insulation film 340 and a portion of the second hole H2 of the second insulation film 350, may be disposed on the auxiliary electrode 330.

The bank 360 may include a third hole H3 exposing a portion of the upper surface of the auxiliary electrode 330 and may overlap a portion of the upper surface of the auxiliary electrode 330 which overlaps the first hole H1 of the first insulation film 340 and the second hole H2 of the second insulation film 350. The light emitting layer of the light emitting device LED may not be disposed in the area (area Y of FIG. 8) in which the upper surface of the auxiliary electrode 330 overlaps the bank 360, of the area having the first hole H1 of the first insulation film 340.

As the second electrode of the light emitting device LED is disposed in a portion of the area (area Y of FIG. 8), in which the upper surface of the auxiliary electrode 330 overlaps the bank 360, of the area in which the first hole H1 of the first insulation film is disposed, the second electrode of the light emitting device LED and the upper surface of the auxiliary electrode 330 may contact each other.

This structure is discussed below in greater detail with reference to FIG. 9.

Figure 9:
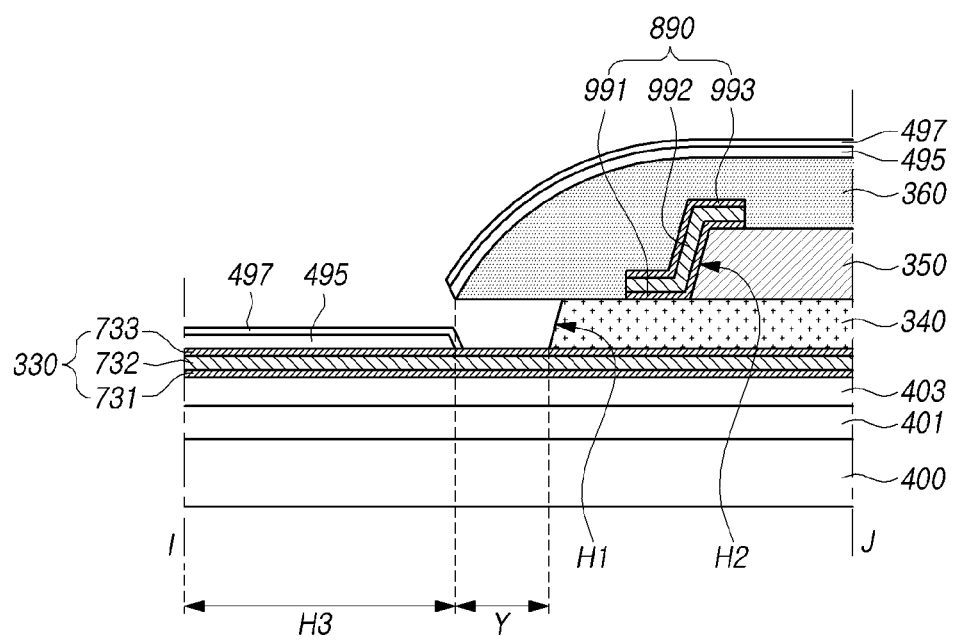
FIG. 9 is a cross-sectional view taken along line I-J of FIG. 8.

FIG. 9 is a cross-sectional view taken along line I-J of FIG. 8.

Substantially the same configurations and effects as those described above are not repeatedly described below. In the following description, the same reference numbers may be used to denote the same elements or components as those described in the above aspects.

Referring to FIG. 9, a buffer layer 401 and an inter-layer insulation film 403 may be disposed on a substrate 400, and an auxiliary electrode 330 may be disposed on the inter-layer insulation film 403.

A first insulation film 340 including a first hole H1 may be disposed on a portion of the upper surface of the auxiliary electrode 330. The first hole H1 of the first insulation film 340 may overlap a portion of the auxiliary electrode 330.

An electrode pattern 890 and a second insulation film 350 may be disposed on a portion of the upper surface of the first insulation film 340.

The electrode pattern 890 may include a first electrode pattern 991 disposed on the first insulation film 340, a second electrode pattern 992 disposed on the first electrode pattern 991, and a third electrode pattern 993 disposed on the second electrode pattern 992. Referring to FIG. 9, the electrode pattern 890 may contact the upper surface of the first insulation film 340, a side surface of the second insulation film 350, and the upper surface of the second insulation film 350. A first end of the electrode pattern 890 may be positioned on the upper surface of the first insulation film 340, and a second end of the electrode pattern 890 may be positioned on the upper surface of the second insulation film 350. The first end of the electrode pattern 890 may be located further inside the side surface of the first insulation film 340.

The electrode pattern 890 may not overlap the first hole H1 of the first insulation film 340. In other words, the electrode pattern 890 may not overlap the auxiliary electrode 330 overlapping the first hole H1 of the first insulation film 340.

Accordingly, it is possible to prevent damage to the electrode pattern 890 due to static electricity between the electrode pattern 890 and the auxiliary electrode 330.

The second insulation film 350 may include a second hole H2 overlapping the first hole H1 of the first insulation film 340 and exposing a portion of the upper surface of the first insulation film 340.

As described above, the electrode pattern 890 may be disposed on the first insulation film 340 and may be disposed in the second hole H2 of the second insulation film 350.

A portion of the electrode pattern 890 may be disposed on the second insulation film 350. For example, as illustrated in FIG. 9, a portion of the electrode pattern 890 may be disposed on the upper surface of the second insulation film 350, another portion of the electrode pattern 890 may be disposed on a side surface of the second insulation film 350, and the remaining portion of the electrode pattern 890 may be disposed on the upper surface of the first insulation film 340.

A bank 360 may be disposed on the first insulation film 340 on which the second insulation film 350 and the electrode pattern 890 are disposed.

The bank 360 may overlap the second insulation film 350 and may overlap the entire electrode pattern 890. Referring to FIG. 9, the bank 360 may cover two opposite ends and an upper surface of the electrode pattern 890.

The electrode pattern 890 may be disposed on the first insulation film 340, enhancing the adhesion between the bank 360 and the electrode pattern 690 and hence preventing the bank 360 from separating from the first insulation film 340.

Further, as the upper and side surfaces of the electrode pattern 890 are covered by the bank 360, oxidation and denaturation of the electrode pattern 890 may be prevented.

The bank 360 may be disposed to overlap a portion of the upper surface of the auxiliary electrode 330 overlapping the first hole H1 of the first insulation film 340.

The auxiliary electrode 330 may include a portion of the upper surface, covered by the bank 360, in the area where it does not overlap the first insulation film 340, the second insulation film 350, and the electrode pattern 890 while overlapping the bank 360. As such, with the structure in which the first hole H1 of the first insulation film 340 overlaps the bank 360 in the area where the auxiliary electrode 330 is disposed, it is possible to implement an under-cut structure through the bank 360 and the first insulation film 340 without a separate barrier rib structure.

A light emitting layer 495 and a second electrode 497 may be disposed on the bank 360.

The light emitting layer 495 may also be disposed on the first insulation film 340, the second insulation film 350, and the upper surface of the auxiliary electrode 330 that does not overlap the bank 360. In other words, the light emitting layer 495 may be disposed on the upper surface of the bank 360 and in the third hole H3 of the bank 360.

The second electrode 497 may be disposed on the light emitting layer 495 and may also be disposed on a portion of the upper surface of the auxiliary electrode 330 in an area where the first hole H1 of the first insulation film 340 and the bank 360 overlap. Accordingly, the second electrode 497 may contact a portion of the upper surface of the auxiliary electrode 330 in the first hole H1 of the first insulation film 340.

A structure of an electroluminescent display device according to another aspect of the disclosure is discussed below with reference to FIGS. 10 and 11.

Figure 10:
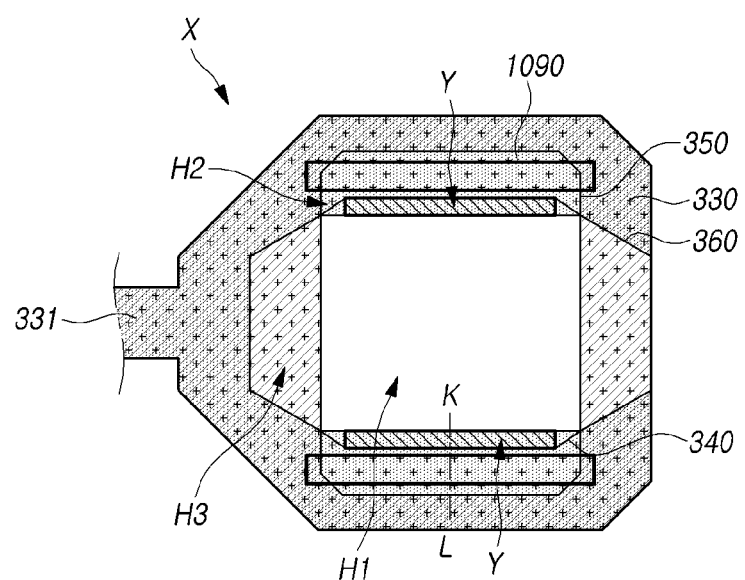
FIG. 10 is a view illustrating another aspect of area X of FIG. 3.

FIG. 10 is a view illustrating another aspect of area X of FIG. 3.

Substantially the same configurations and effects as those described above are not repeatedly described below. In the following description, the same reference numbers may be used to denote the same elements or components as those described in the above aspects.

Referring to FIG. 10, a first insulation film 340 including a first hole H1 exposing a portion of an upper surface of the auxiliary electrode 330 may be disposed.

A second insulation film 350 including a second hole H2 overlapping the first hole H1 may be disposed on the auxiliary electrode 330.

An electrode pattern 1090 may be disposed on the auxiliary electrode 330. The electrode 1090 may be spaced apart from the second insulation film 350 in the second hole H2.

The bank 360, which overlaps the first insulation film 340, the second insulation film 350, and the electrode pattern 1090 may overlap a portion of the first hole H1 of the first insulation film 340 and a portion of the second hole H2 of the second insulation film 350, may be disposed on the auxiliary electrode 330.

In the area where the bank 360 overlaps the second hole H2, the bank 360 may also be disposed in an area between the auxiliary electrode 330 and the second insulation film 350.

The bank 360 may include a third hole H3 exposing a portion of the upper surface of the auxiliary electrode 330 and may overlap a portion of the upper surface of the auxiliary electrode 330 which overlaps the first hole H1 of the first insulation film 340 and the second hole H2 of the second insulation film 350.

A light emitting layer of a light emitting device LED and a second electrode may be disposed in the third hole H3 of the bank 360.

As the second electrode of the light emitting device LED is disposed on a portion of the area (area Y of FIG. 8), where the upper surface of the auxiliary electrode 330 overlaps the bank 360, of the area where the first hole H1 of the first insulation film 340 not overlapping the third hole H3 of the bank 360 is disposed, the second electrode of the light emitting device LED may contact the upper surface of the auxiliary electrode 330.

This structure is discussed below in detail with reference to FIG. 11.

Figure 11:
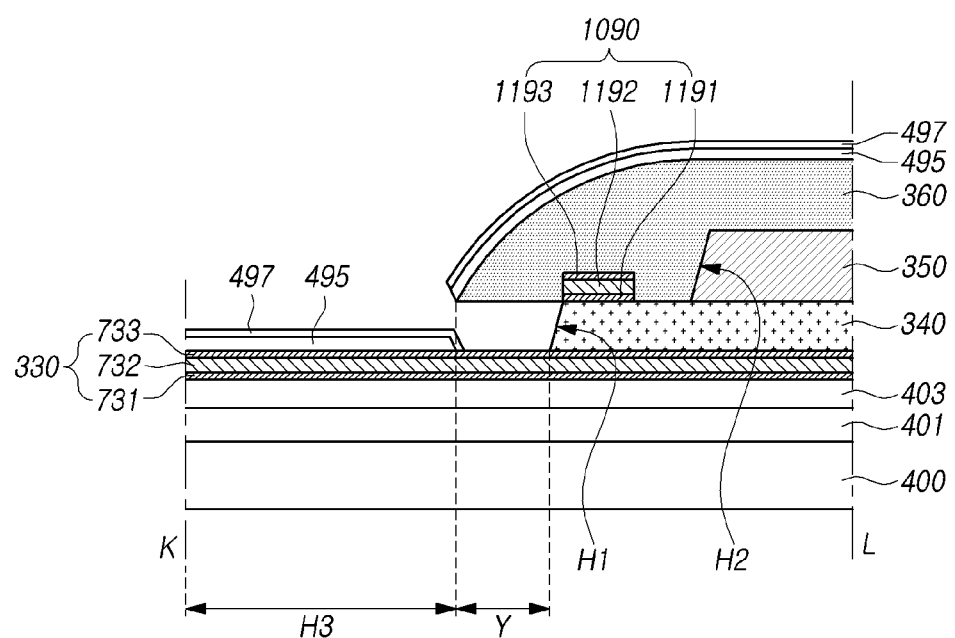
FIG. 11 is a cross-sectional view taken along line K-L of FIG. 10.

FIG. 11 is a cross-sectional view taken along line K-L of FIG. 10.

Substantially the same configurations and effects as those described above are not repeatedly described below. In the following description, the same reference numbers may be used to denote the same elements or components as those described in the above aspects.

Referring to FIG. 11, a first insulation film 340 including a first hole H1 exposing a portion of an upper surface of the auxiliary electrode 330 may be disposed on the auxiliary electrode 330.

An electrode pattern 1090 and a second insulation film 350 may be disposed on a portion of the upper surface of the first insulation film 340. Referring to FIG. 11, the lower surface of the electrode pattern 1090 may contact the upper surface of the first insulation film 340. Two opposite ends of the electrode pattern 1090 may be positioned on the upper surface of the first insulation film 340. A first end of the electrode pattern 1090 may be formed to be spaced apart from the side surface of the second insulation film 350, and a second end of the electrode pattern 1090 does not protrude beyond the side surface of the first insulation film 340.

The electrode pattern 1090 may include a first electrode pattern 1191, a second electrode pattern 1192, and a third electrode pattern 1193.

The second insulation film 350 may include a second hole H2 overlapping the first hole H1 of the first insulation film 340 and exposing a portion of the upper surface of the first insulation film 340.

In the second hole H2 of the second insulation film 350, the electrode pattern 1090 and the second insulation film 350 may be spaced apart from each other.

The electrode pattern 1090 may not overlap the first hole H1 of the first insulation film 340 nor may the electrode pattern 1090 overlap the auxiliary electrode 330 overlapping the first hole H1.

A bank 360 may be disposed on the first insulation film 340, the electrode pattern 1090, and the second insulation film 350.

The bank 360 may overlap the second insulation film 350 and may overlap the entire electrode pattern 1090. Referring to FIG. 11, the bank 360 may cover two opposite ends and the upper surface of the electrode pattern 1090. The bank 360 may be disposed in an area where one end of the electrode pattern 1090 is spaced apart from the second insulation film 350. Accordingly, the bank 360 may cover one end of the electrode pattern 1090 and a side surface of the second insulation film 350.

The bank 360 may also be disposed in the area where the electrode pattern 1090 and the second insulation film 350 are spaced apart from each other, in the second hole H2 of the second insulation film 350. The bank 360 disposed between the electrode pattern 1090 and the second insulation film 350 may contact the upper surface of the first insulation film 340.

Meanwhile, as the first to third electrode patterns 1191, 1192, and 1193 of the electrode pattern 1090 include a transparent conductive material or a reflective material, the adhesive force between the electrode pattern 1090 and the first insulation film 340 may be greater than the adhesive force between the first insulation film 340 and the bank 360.

Further, as the first to third electrode patterns 1191, 1192, and 1193 of the electrode pattern 1090 include a transparent conductive material or a reflective material, the adhesive force between the electrode pattern 1090 and the bank 360 may be greater than the adhesive force between the first insulation film 340 and the bank 360.

Accordingly, even with the structure in which the bank 360 and the first insulation film 340 partially contact each other, the bank 360, the electrode pattern 1090, and the first insulation film 340 may be prevented from being separated from each other as the electrode pattern 1090 is disposed between the bank 360 and the first insulation film 340.

The bank 360 may be disposed to overlap a portion of the upper surface of the auxiliary electrode 330 overlapping the first hole H1 of the first insulation film 340.

A light emitting layer 495 and a second electrode 497 may be disposed on the bank 360.

Specifically, the light emitting layer 495 may be disposed on the bank 360 and may also be disposed on the first insulation film 340, the second insulation film 350, and the upper surface of the auxiliary electrode 330 not overlapped with the bank 360. In other words, the light emitting layer 495 may be disposed on the upper surface of the auxiliary electrode 330 overlapping the third hole H3 of the bank 360.

The second electrode 497 may be disposed on the light emitting layer 495 and may also be disposed on a portion of the upper surface of the auxiliary electrode 330 disposed in an area where the first hole H1 of the first insulation film 340 and the bank 360 overlap. Accordingly, the second electrode 497 may contact a portion of the upper surface of the auxiliary electrode 330 in the first hole H1 of the first insulation film 340 and may thus be electrically connected with the auxiliary electrode 330.

In other words, the second electrode 497 may be disposed on the bank 360, may also be disposed on the auxiliary electrode 330 overlapping the third hole H3 of the bank 360, and may also be disposed on a portion of the upper surface of the auxiliary electrode 330 which overlaps the first hole H1 of the first insulation film 340 not overlapped with the third hole H3.

As the second electrode 497 is electrically connected with the auxiliary electrode 330 via such a structure, it is possible to prevent degradation of the luminance characteristics of the electroluminescent display device due to a voltage drop caused by the second electrode 497.

Although FIGS. 3 to 11 illustrate a structure in which the auxiliary electrode 330 is disposed in a portion of the transmission area, aspects of the disclosure are not limited thereto.

For example, the auxiliary electrode 330 and the auxiliary line 331 integrated with the auxiliary electrode 330 may be disposed in an emission area or a non-emission area adjacent to the transmission area.

This is described below with reference to FIGS. 12 and 13.

Figure 12:
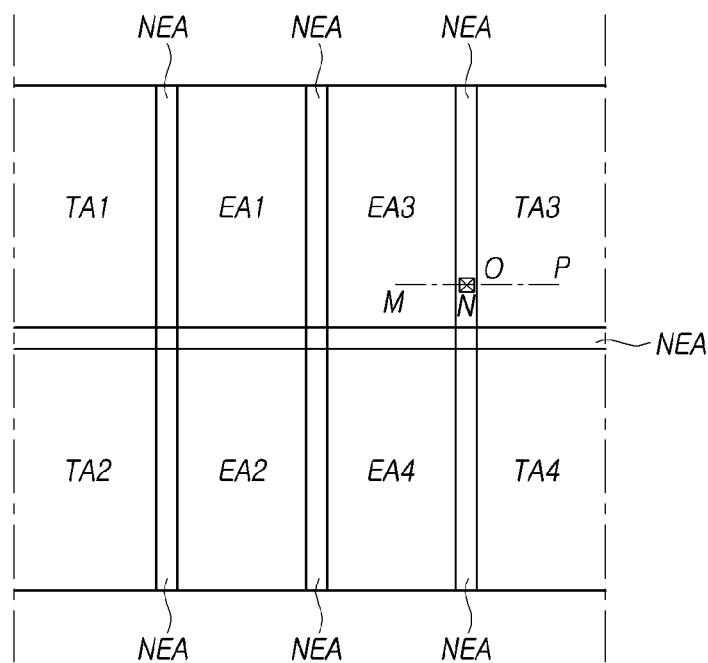
FIG. 12 is a view illustrating a partial area of an active area of an electroluminescent display device according to other aspects of the disclosure.

FIG. 12 is a view illustrating a partial area of an active area of an electroluminescent display device according to other aspects of the disclosure.

Substantially the same configurations and effects as those described above are not repeatedly described below. In the following description, the same reference numbers may be used to denote the same elements or components as those described in the above aspects.

Referring to FIG. 12, according to aspects of the disclosure, an active area AA of an electroluminescent display device 100 may include a plurality of emission areas EA1, EA2, EA3, and EA4 and a plurality of transmission areas TA1, TA2, TA3, and TA4.

The active area AA may include a non-emission area NEA disposed between the emission area and the transmission area. The active area AA may also include a non-emission area NEA disposed between different emission areas. The active area AA may also include a non-emission area NEA disposed between different transmission areas.

At least one contact portion 1230, where the auxiliary electrode and the second electrode of the light emitting device are in contact, may be disposed in the non-emission area NEA of the active area AA.

For example, the contact portion 1230 may be disposed in the non-emission area NEA between one emission area EA3 (a third emission area) and one transmission area TA3 (a third transmission area), but aspects of the disclosure are not limited thereto.

A structure in which the contact portion 1230 is disposed in the non-emission area NEA is described below in detail.

Figure 13:
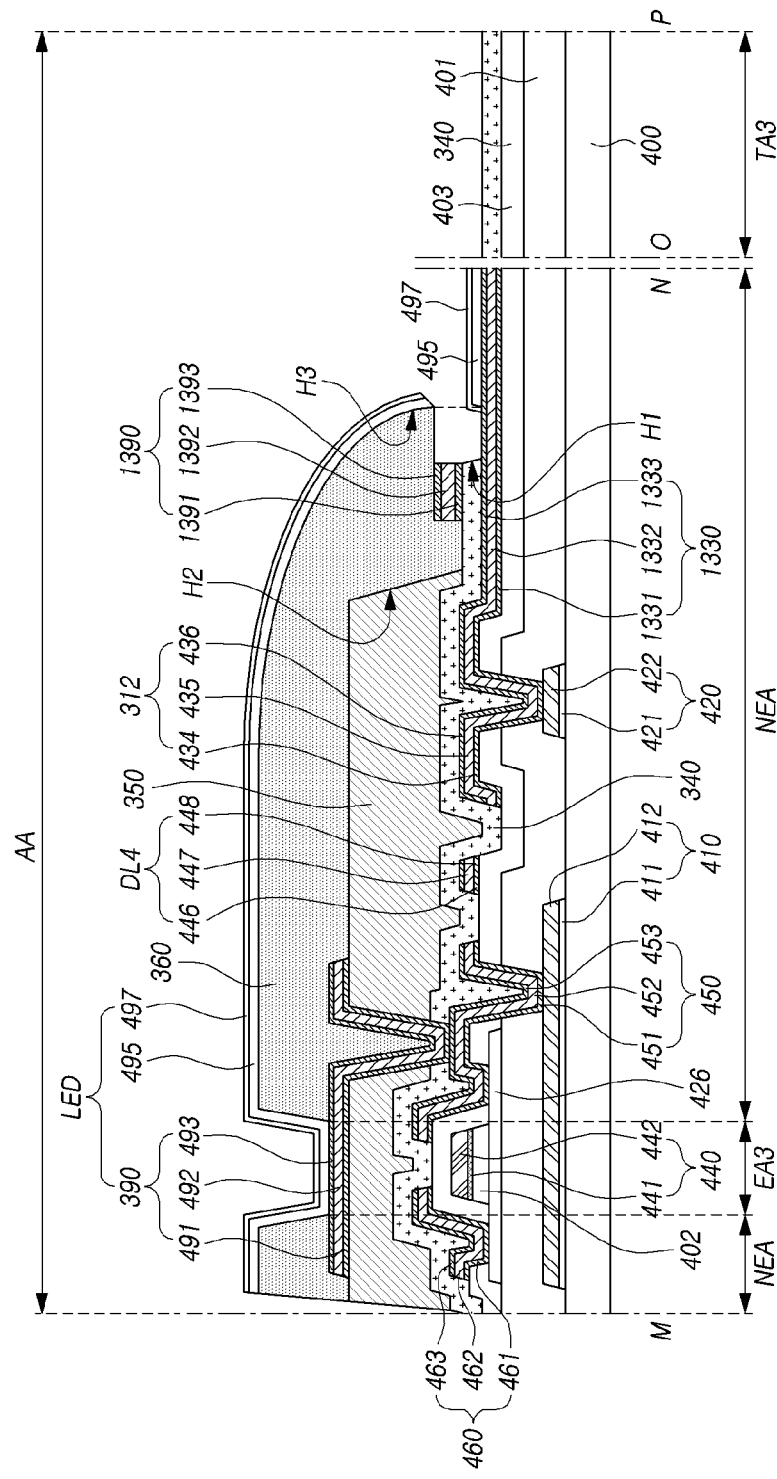
FIG. 13 is a cross-sectional view taken along line M-N and line O-P of FIG. 12.

FIG. 13 is a cross-sectional view taken along line M-N and line O-P of FIG. 12.

Line M-N of FIG. 12 is a line along which a portion of the third emission area EA3 and the non-emission area NEA is cut, and line O-P of FIG. 12 is a line along which a portion of the third transmission area TA3 is cut.

Substantially the same configurations and effects as those described above are not repeatedly described below. In the following description, the same reference numbers may be used to denote the same elements or components as those described in the above aspects.

Referring to FIG. 13, the active area AA may include a third emission area EA3, a non-emission area NEA, and a third transmission area TA3.

In the active area AA, the light blocking layer 410, the third voltage line 420, the active layer 426, the gate electrode 440, the source electrode 450, the drain electrode 460, the fourth data line DL4, and the light emitting device LED may be disposed on the substrate 400.

The second voltage line 312, disposed on the same layer as the source electrode 450, the drain electrode 460, and the fourth data line DL4, may be disposed in the non-emission area NEA of the active area AA.

The second voltage line 312 may be integrally formed with the auxiliary electrode 1130. The auxiliary electrode 1130 may be referred to as an auxiliary line, and the auxiliary electrode 1130 and the auxiliary line may have substantially the same component. Thus, for ease of description, the auxiliary line is referred to as the auxiliary electrode 1130 in the following description.

The auxiliary electrode 1330 may also be disposed in the non-emission area NEA of the active area AA.

The auxiliary electrode 1330 may include a first auxiliary electrode 1331 disposed on the inter-layer insulation film 403, a second auxiliary electrode 1332 disposed on the first auxiliary electrode 1331, and a third auxiliary electrode 1333 disposed on the second auxiliary electrode 1332.

A first insulation film 340 may be disposed on the source electrode 450, the drain electrode 460, the fourth data line DL4, the second voltage line 312, and the auxiliary electrode 1330.

The first insulation film 340 may include a first hole H1 exposing a portion of the upper surface of the auxiliary electrode 1330 in the non-emission area NEA.

An electrode pattern 1390 and a second insulation film 350 may be disposed on a portion of the upper surface of the first insulation film 340.

The electrode pattern 1390 may include a first electrode pattern 1391 disposed on the first insulation film 340, a second electrode pattern 1392 disposed on the first electrode pattern 1391, and a third electrode pattern 1393 disposed on the second electrode pattern 1392.

The electrode pattern 1390 may be formed in the same process as the first electrode 390 of the light emitting device LED.

The first electrode pattern 1391 of the electrode pattern 1390 and the lower electrode 491 of the first electrode 390 may include the same material. The second electrode pattern 1392 of the electrode pattern 1390 and the upper electrode 492 of the first electrode 390 may include the same material. The third electrode pattern 1393 of the electrode pattern 1390 and the cover electrode 493 of the first electrode 390 may include the same material.

The angle between the side surface of each of the electrode pattern 1390 and the first electrode 390 and the surface of the first insulation film 340 may be 90 degrees, but aspects of the disclosure are not limited thereto and, depending on processing conditions, the angle between the side surface of each of the electrode pattern 1390 and the first electrode 390 and the surface of the first insulation film 340 may be smaller than 90 degrees.

The electrode pattern 1390 may not overlap the first hole H1 of the first insulation film 340 nor may the electrode pattern 1390 overlap the auxiliary electrode 1330 overlapping the first hole H1. Accordingly, it is possible to prevent damage to the electrode pattern 1390 due to static electricity.

The second insulation film 350 disposed on the first insulation film 340 may include a second hole H2 overlapping the first hole H1 of the first insulation film 340 and exposing a portion of the upper surface of the first insulation film 340. In other words, the second insulation film 350 may expose a portion of the upper surface of the first insulation film 340 through the second hole H2.

The insulation pattern 1390 may be disposed on a portion of the upper surface of the first insulation film 340 exposed by the second insulation film 350.

Although FIG. 13 illustrates a structure in which the insulation pattern 1390 is spaced apart from the second insulation film 350 in the second hole H2 of the second insulation film 350, aspects of the disclosure are not limited thereto. The arrangement of the second insulation film 350 and the electrode patterns 690 and 890 of FIGS. 6 to 9 described above may be applied.

A bank 360 may be disposed on the second insulation film 350, the electrode pattern 1390, and the first insulation film 340. The bank 360 may be disposed on a portion of the upper surface of the first electrode 390 of the light emitting device LED.

The bank 360 may overlap the entire electrode pattern 1390. Specifically, the bank 360 may cover the entire upper and side surfaces of the electrode pattern 1390. Since the electrode pattern 1390 is protected by the bank 360, oxidation and denaturation may not occur.

The bank 360 may be disposed to overlap a portion of the upper surface of the auxiliary electrode 330 overlapping the first hole H1 of the first insulation film 340.

Accordingly, the auxiliary electrode 330 may include an area that overlaps the bank 360 but does not overlap the first insulation film 340, the second insulation film 350, and the electrode pattern 690. As such, with the structure in which the first hole H1 of the first insulation film 340 overlaps the bank 360 in the area where the auxiliary electrode 330 is disposed, it is possible to implement an under-cut structure through the bank 360 and the first insulation film 340 without a separate barrier rib structure.

A light emitting layer 495 of a light emitting device (LED) may be disposed on the bank 360.

The bank 360 may include a third hole H3 overlapping a portion of the first hole H1 of the first insulation film 340 and a portion of the second hole H2 of the second insulation film 350. The light emitting layer 495 may also be disposed on the upper surface of the auxiliary electrode 330 overlapping the third hole H3 of the bank 360.

The light emitting layer 495 may not be disposed in the area where the first hole H1 of the first insulation film 340 and the bank 360 overlap.

The second electrode 497 of the light emitting device LED may be disposed on the light emitting layer 495.

The second electrode 497 may overlap the entire light emitting layer 495.

The second electrode 497 may also be disposed on a portion of the upper surface of the auxiliary electrode 330 in the area where the first hole H1 of the first insulation film 340 and the bank 360 overlap. Thus, the second electrode 497 and the auxiliary electrode 330 may be electrically connected.

In other words, as a portion of the upper surface of the auxiliary electrode 330 is exposed through the first hole H1 of the first insulation film 340, the second hole H2 of the second insulation film 350 disposed on the first insulation film 340 overlaps the first hole H1 in a larger area than the first hole H1, and the bank 360 overlapping a portion of the first hole H1 is disposed on the second insulation film 350, the light emitting layer 495 of the light emitting device LED may not be disposed on a portion of the upper surface of the auxiliary electrode 330. As the second electrode 497 of the light emitting device LED contacts a portion of the upper surface of the auxiliary electrode 330 in which the light emitting layer 495 is not disposed, it is possible to prevent deterioration of the luminance characteristics of the electroluminescent display device due to a voltage drop caused by the second electrode 497.

Further, in the electroluminescent display device 100 including a plurality of transmissive areas as illustrated in FIGS. 12 and 13, the area in which the auxiliary electrode 330 and the second electrode 497 of the light emitting device LED are in contact is disposed in the non-emission area NEA, not in the transmission area, so that the transmittance of the transmission area may be enhanced.

Although FIGS. 12 and 13 illustrate a structure in which the area in which the auxiliary electrode 330 and the second electrode 497 of the light emitting device LED are in contact is disposed in the non-emission area NEA, aspects of the disclosure are not limited thereto.

If the electroluminescent display device 100 is a top emission-type electroluminescent display device, the area in which the auxiliary electrode 330 contacts the second electrode 497 of the light emitting device LED may overlap the emission area.

The above description has been presented to enable any person skilled in the art to make and use the technical idea of the disclosure and has been provided in the context of a particular application and its requirements. Various modifications, additions and substitutions to the described aspects will be readily apparent to those skilled in the art, and the general principles defined herein may be applied to other aspects and applications without departing from the spirit and scope of the disclosure. The above description and the accompanying drawings provide an example of the technical idea of the disclosure for illustrative purposes only. That is, the disclosed aspects are intended to illustrate the scope of the technical idea of the disclosure. Thus, the scope of aspects of the disclosure are not limited to the aspects shown but is to be accorded the widest scope consistent with the claims. The scope of protection of the disclosure should be construed based on the following claims, and all technical ideas within the scope of equivalents thereof should be construed as being included within the scope of the disclosure.

What is claimed is:

1. An electroluminescent display device, comprising:
   at least one auxiliary electrode disposed on a substrate;
   a first insulation film disposed on the auxiliary electrode and including a first hole exposing a portion of an upper surface of the auxiliary electrode;
   a second insulation film disposed on the first insulation film and including a second hole exposing a portion of an upper surface of the first insulating film;
   an electrode pattern disposed on a portion of an upper surface of the first insulation film and overlapping the second hole of the second insulation film;
   a first electrode of a light emitting device disposed on the second insulation film;
   a bank disposed on the upper surface of the first insulation film exposed by the second hole and an upper surface of the second insulation film, and defining a third hole;
   a light emitting layer of the light emitting device, disposed on the first electrode and the bank; and
   a second electrode of the light emitting device, disposed on the light emitting layer and electrically connected to the upper surface of the auxiliary electrode exposed by the first hole of the first insulation film,
   wherein the bank is extended to be above the first hole and overlaps with a portion of the first hole, and
   wherein the second electrode is electrically connected to the upper surface of the auxiliary electrode exposed by the first hole of the first insulation film while not overlapping with the third hole of the bank.

2. The electroluminescent display device of claim 1, wherein an area of the second hole of the second insulation film is larger than an area of the first hole of the first insulation film.

3. The electroluminescent display device of claim 1, wherein the bank disposed on a portion of the second insulation film, a portion of the first electrode, a portion of the first hole of the first insulation film, and an entire electrode pattern.

4. The electroluminescent display device of claim 1, wherein the light emitting layer is disposed on the auxiliary electrode overlapping with the third hole of the bank.

5. The electroluminescent display device of claim 4, wherein the second electrode is disposed on the light emitting layer disposed on the auxiliary electrode exposed by the third hole of the bank.

6. The electroluminescent display device of claim 1, wherein the electrode pattern does not overlap with the first hole of the first insulation film.

7. The electroluminescent display device of claim 1, wherein a portion of the electrode pattern overlaps the second insulation film.

8. The electroluminescent display device of claim 7, wherein a portion of the bank and a portion of an upper surface of the first insulation film contact each other in an area between the first hole of the first insulation film and the electrode pattern.

9. The electroluminescent display device of claim 1, wherein the electrode pattern is spaced apart from the second insulation film.

10. The electroluminescent display device of claim 9, wherein a portion of the bank and an upper surface of the first insulation film contact each other in an area between the electrode pattern and the second insulation film.

11. The electroluminescent display device of claim 1, wherein a portion of the bank overlaps a portion of the auxiliary electrode overlapping with the first hole of the first insulation film, and
wherein the light emitting layer and the second electrode are not disposed in a partial area of the area where the bank and the auxiliary electrode overlap with each other.

12. The electroluminescent display device of claim 1, wherein the electrode pattern includes a first electrode pattern, a second electrode pattern disposed on the first electrode pattern, and a third electrode pattern disposed on the second electrode pattern,
wherein the first electrode pattern and the third electrode pattern include a transmissive conductive material, and
wherein the second electrode pattern includes a reflective material.

13. The electroluminescent display device of claim 12, wherein an entire side surface of the second electrode pattern is surrounded by the bank.

14. The electroluminescent display device of claim 1, wherein an active area of the electroluminescent display device includes a plurality of emission areas, a non-emission area surrounding the plurality of emission areas, and a plurality of transmission areas adjacent to the emission areas and the non-emission area, and
wherein the at least one auxiliary electrode is disposed in at least one of the transmission areas or the non-emission area.

15. The electroluminescent display device of claim 1, further comprising a thin film transistor disposed on the substrate and including a gate electrode, an active layer, a source electrode, and a drain electrode,
wherein the auxiliary electrode is disposed on a same layer as the source electrode and the drain electrode.

16. The electroluminescent display device of claim 15, further comprising a plurality of voltage lines disposed on the substrate and disposed on a same layer as the source electrode and the drain electrode,
wherein the auxiliary electrode is integrally formed with a line branched from at least one voltage line.

17. A display panel, comprising:
at least one auxiliary electrode disposed on a substrate;
a first insulation film disposed on the auxiliary electrode and including a first hole exposing a portion of an upper surface of the auxiliary electrode;
a second insulation film disposed on the first insulation film and including a second hole exposing a portion of an upper surface of the first insulating film;
an electrode pattern disposed on least one of the first insulating film and the second insulating film;
a first electrode of a light emitting device disposed on the second insulation film;
a bank disposed on the upper surface of the first insulation film exposed by the second hole and an upper surface of the second insulation film;
a light emitting layer of the light emitting device, disposed on the first electrode and the bank and disposed on the portion of the upper surface of the auxiliary electrode; and
a second electrode of the light emitting device, disposed on the light emitting layer and electrically connected to the upper surface of the auxiliary electrode overlapping with the first hole of the first insulation film while not overlapping with a third hole of the bank.

* * * * *